United States Patent
Leng

(10) Patent No.: US 11,600,566 B2
(45) Date of Patent: Mar. 7, 2023

(54) INTEGRATED CIRCUIT E-FUSE HAVING AN E-FUSE ELEMENT PROVIDING A DIFFUSION BARRIER FOR UNDERLYING E-FUSE TERMINALS

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 17/233,311

(22) Filed: Apr. 16, 2021

(65) Prior Publication Data

US 2022/0270968 A1 Aug. 25, 2022

Related U.S. Application Data

(60) Provisional application No. 63/152,907, filed on Feb. 24, 2021.

(51) Int. Cl.
*H01L 23/525* (2006.01)
*H01L 21/768* (2006.01)

(52) U.S. Cl.
CPC .... *H01L 23/5256* (2013.01); *H01L 21/76841* (2013.01); *H01L 21/76892* (2013.01)

(58) Field of Classification Search
CPC .................. H01L 23/62; H01L 23/525; H01L 23/5256–5258; H01L 27/1026;

(Continued)

(56) References Cited

U.S. PATENT DOCUMENTS

2001/0042897 A1  11/2001  Yeh et al. ................ 257/529
2003/0003617 A1   1/2003  Ikeda et al. ............... 438/37

(Continued)

FOREIGN PATENT DOCUMENTS

JP  2006228792 A  8/2006  ......... H01L 21/3205

OTHER PUBLICATIONS

International Search Report and Written Opinion, Application No. PCT/US2021/036379, 13 pages, dated Dec. 1, 2021.

*Primary Examiner* — Laura M Menz
*Assistant Examiner* — Candice Chan
(74) *Attorney, Agent, or Firm* — Slayden Grubert Beard PLLC

(57) ABSTRACT

An electronic fuse (e-fuse) module may be formed in an integrated circuit device. The e-fuse module may include a pair of metal e-fuse terminals (e.g., copper terminals) and an e-fuse element formed directly on the metal e-fuse terminals to define a conductive path between the pair of metal e-fuse terminals through the e-fuse element. The metal e-fuse terminals may be formed in a metal interconnect layer, along with various interconnect elements of the integrated circuit device. The e-fuse element may be formed by depositing and patterning a diffusion barrier layer over the metal e-fuse terminals and interconnect elements formed in the metal interconnect layer. The e-fuse element may be formed from a material that provides a barrier against metal diffusion (e.g., copper diffusion) from each of the metal e-fuse terminals and interconnect elements. For example, the e-fuse element may be formed from titanium tungsten (TiW) or titanium tungsten nitride ($TiW_2N$).

12 Claims, 15 Drawing Sheets

(58) Field of Classification Search
CPC ......... H01L 27/11206; H01L 27/12206; H01L 2924/1456; G11C 17/14–146
See application file for complete search history.

(56) References Cited

U.S. PATENT DOCUMENTS

| | | | |
|---|---|---|---|
| 2012/0193755 A1* | 8/2012 | Dundulachi | H01L 24/05 438/653 |
| 2012/0261793 A1 | 10/2012 | Yang et al. | 257/529 |
| 2013/0320488 A1 | 12/2013 | Anderson et al. | 257/529 |
| 2014/0346674 A1 | 11/2014 | Bao et al. | 257/741 |
| 2019/0181091 A1 | 6/2019 | Briggs et al. | |

* cited by examiner

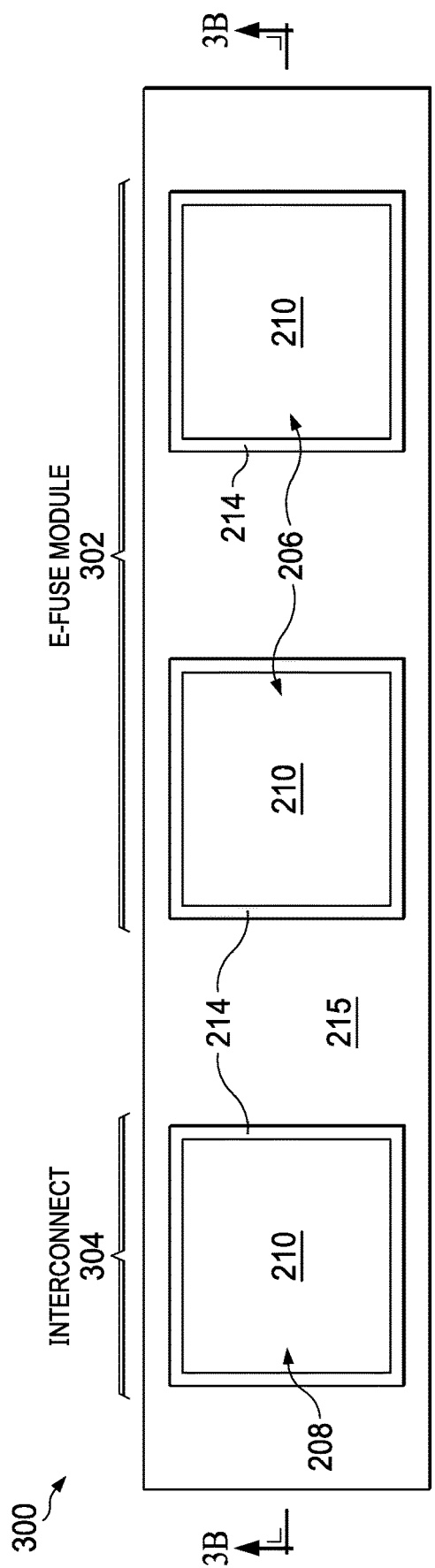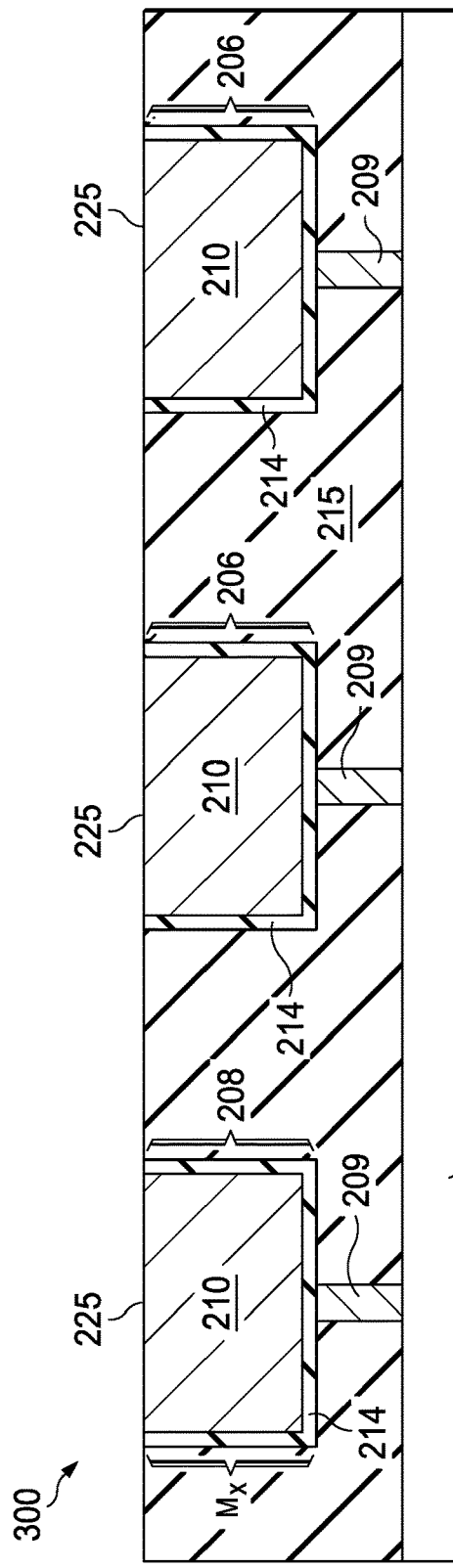
FIG. 3A
FIG. 3B

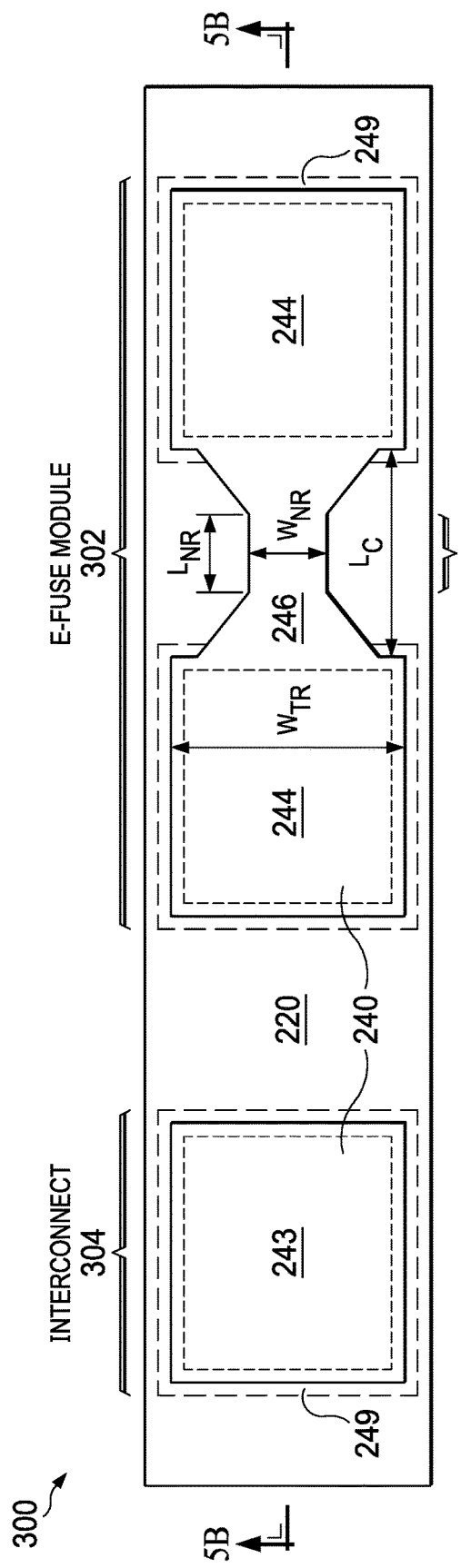
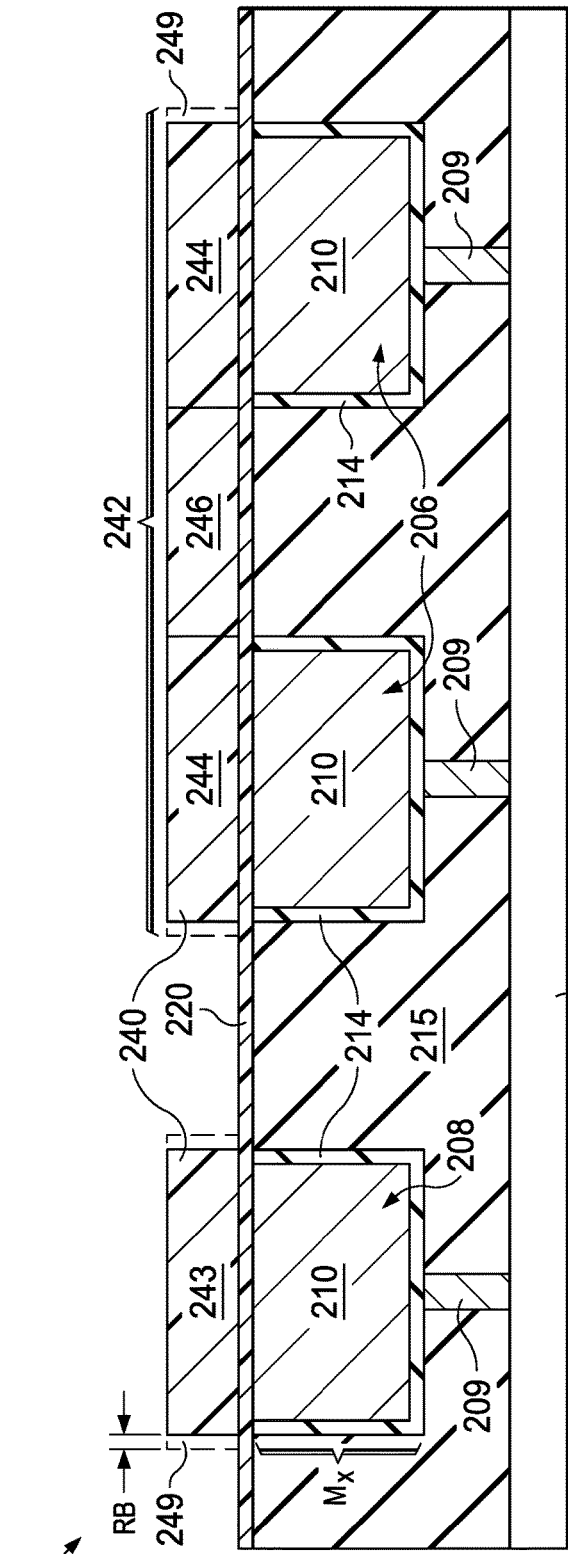
FIG. 5A
FIG. 5B

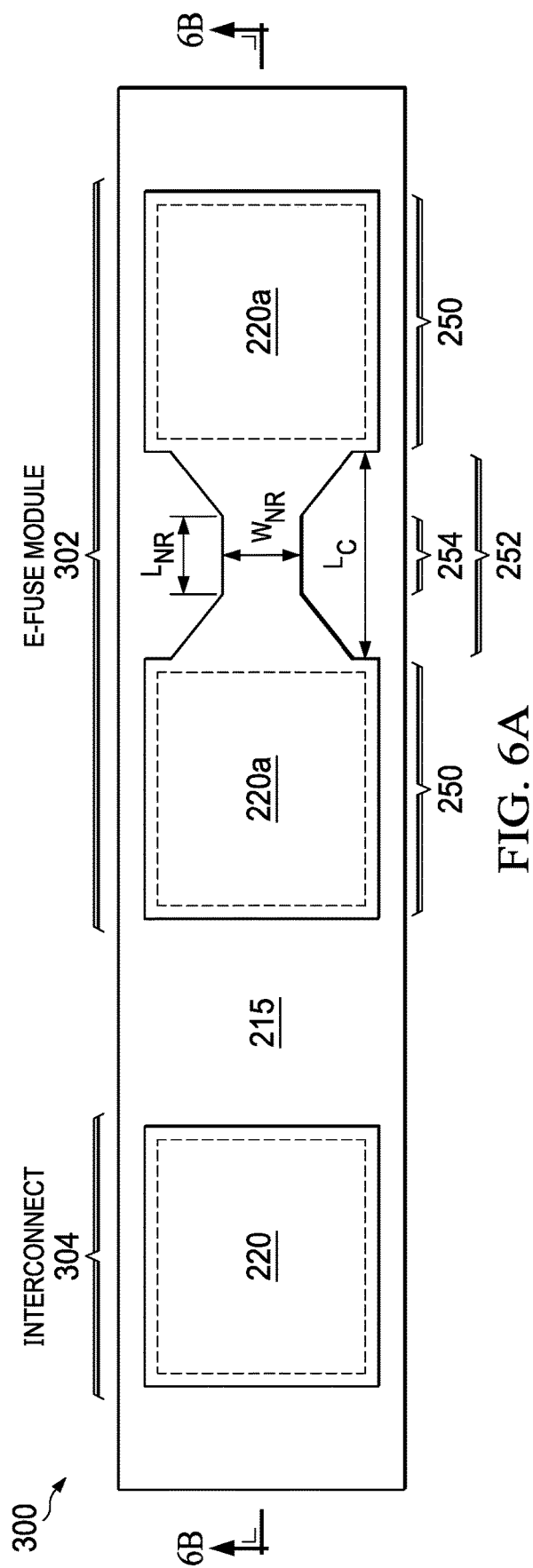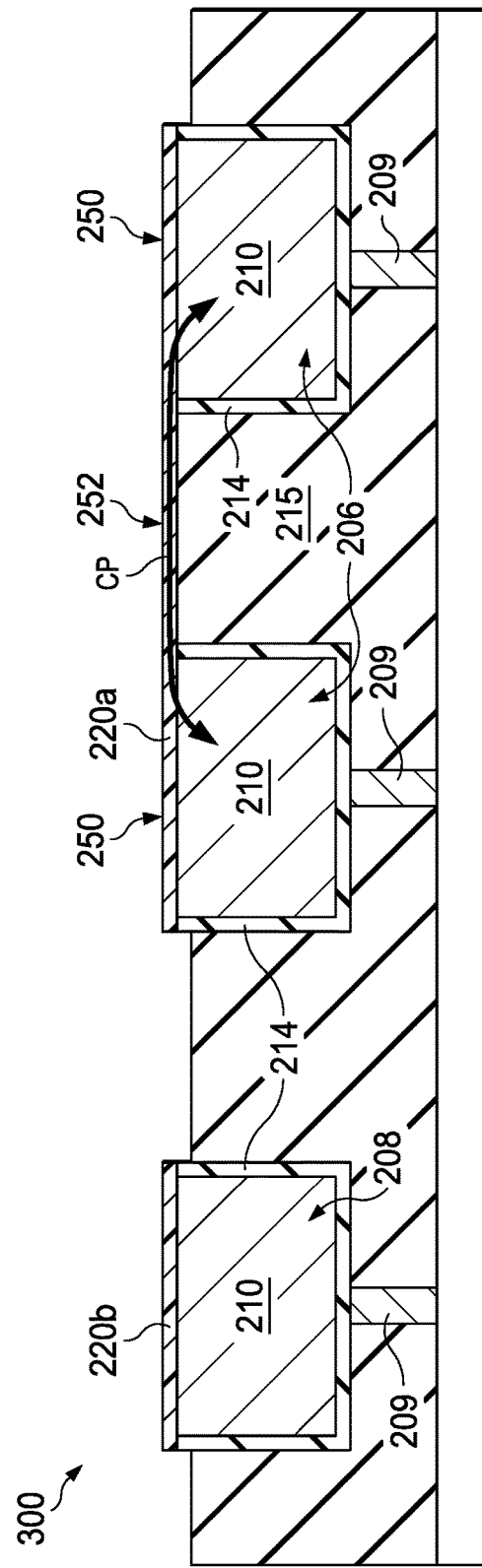
FIG. 6A
FIG. 6B

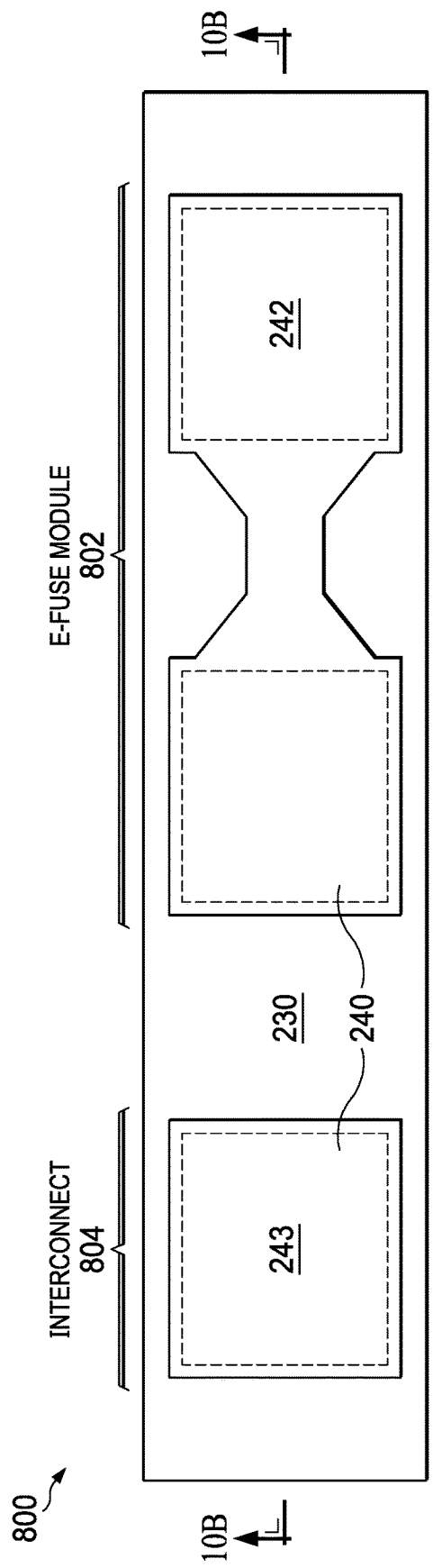
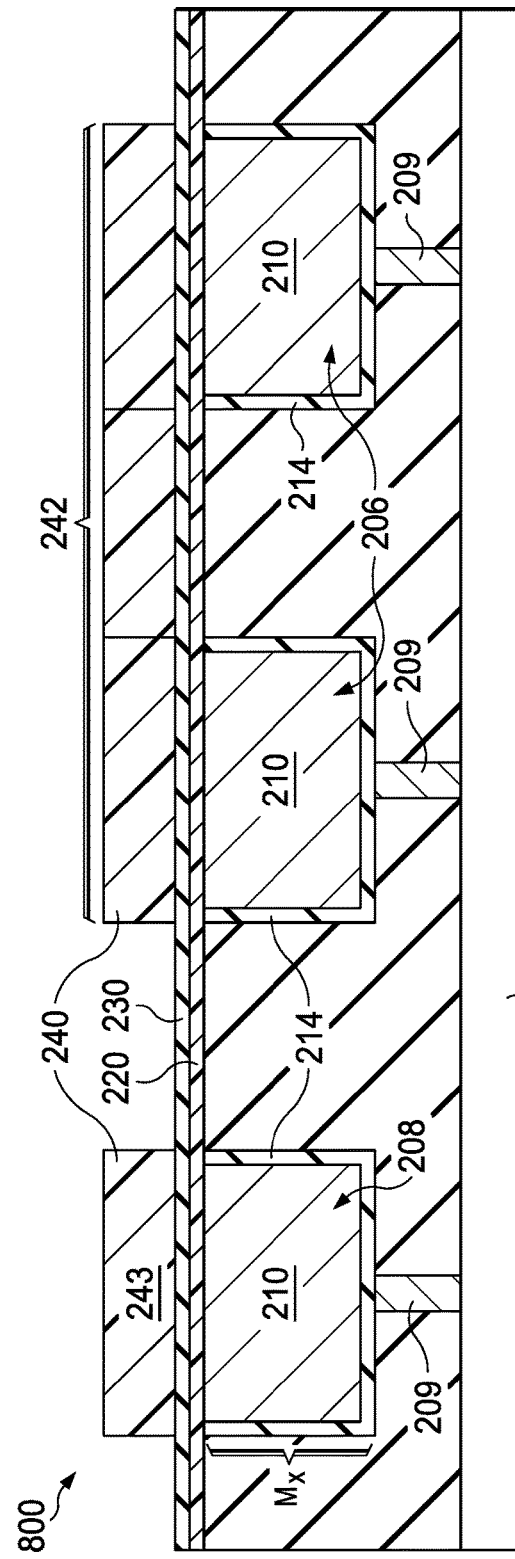
FIG. 10A
FIG. 10B

INTEGRATED CIRCUIT E-FUSE HAVING AN E-FUSE ELEMENT PROVIDING A DIFFUSION BARRIER FOR UNDERLYING E-FUSE TERMINALS

RELATED APPLICATION

This application claims priority to commonly owned U.S. Provisional Patent Application No. 63/152,907 filed Feb. 24, 2021, the entire contents of which are hereby incorporated by reference for all purposes.

TECHNICAL FIELD

The present disclosure relates to electronic fuses (e-fuses) formed an integrated circuit (IC) devices, and more particularly to e-fuses having an e-fuse element that also acts as a diffusion barrier for underlying metal e-fuse terminals, and methods for forming such e-fuses.

BACKGROUND

A fuse is a resistive link, which can be permanently programmed between a low resistance state and a high resistance state. An e-fuse responds to an electric current (as opposed to laser) to cause the change of resistance (programming) from the low resistance state (e.g. less than 1 Kohm) to the high resistance state (e.g. greater than 100 Kohm). E-fuses are useful in a wide range of applications, for example (a) for protection from electrostatic discharge (ESD) during manufacture and handling, (b) for removing or replacing a defective device from a circuit, (c) for programming one-time programmable memory, for example ROM (Read Only Memory), OTP (One Time Programmable memory), or PROM (Programmable Read Only Memory), without limitation, (d) for electronic digital trim of passive components (e.g., resistors, capacitors, or inductors), or (e) to provide chip security by preventing unauthorized access.

In the integrated circuit industry, the predominant type of e-fuse is the silicide polysilicon e-fuse, in which a silicide region formed on the polysilicon forms a low resistance path before programming, and is purposefully destroyed by high current during programming, which changes the fuse to the high resistance state. FIGS. 1A and 1B show a top view and side cross-sectional view, respectively, of a conventional silicide polysilicon e-fuse 100. As shown, the silicide polysilicon e-fuse 100 includes a silicide polysilicon fuse element contacted by tungsten terminals. The silicide polysilicon fuse element may be programmed through electro migration, wherein a large current, for example 10 mA, is driven through the silicide polysilicon fuse element, which ruptures the silicide polysilicon fuse element and thereby switches the e-fuse from a low resistance state to a high resistance state.

However, the silicide polysilicon e-fuse is not available in certain high-k dielectric and metal gate transistor technology. In contrast to silicide polysilicon e-fuse, an e-fuse formed of metal is generally preferred in applications utilizing those high-k dielectric and metal gate transistor technologies due to its low melting point and ease of programming using electromigration. Thus, in some advanced CMOS designs, interconnect metal or via is used as an e-fuse without introducing a dedicated e-fuse metal, through thermally accelerated metal electromigration. However, this process is typically very complicated and requires specialized programming because only some parts of the circuit (components associated with the e-fuse) are programmed by electromigration, while other parts of the circuit (e.g., normal CMOS components) must be protected from electromigration.

To increase programming margin and overall device reliability associated with integrated e-fuses formed of metal, there is a need for improved e-fuses with a dedicated e-fuse metal that can be fabricated cheaply, reliably, and with high density.

For example, there is a need for e-fuse modules formed in copper interconnect, for integration with common IC manufacturing processes. However, using copper interconnect for e-fuse modules presents particular challenges. For example, copper diffuses fast during and/or after interconnect structure manufacturing, which may form deep-level traps and substantially degrade transistor performance. Thus, copper may be encased in a barrier layer to prevent or inhibit such diffusion. A dielectric (non-conductive) barrier layer of silicon nitride (SiN) or silicon carbide (SiC) is commonly formed over copper structures after a copper chemical mechanical polishing (CMP). However, this dielectric barrier formed over the copper structures presents a challenge for connecting an e-fuse element (film) formed of metal to a pair of copper structures (e-fuse terminals). In addition to the challenge of copper diffusion, copper is also susceptible to corrosion. Thus there is a need for e-fuses, formed of metal, constructed in a copper interconnect structure which copper interconnect structure is protected against copper diffusion and corrosion. Further, there is a need to reduce or minimize the number of mask layers needed to construct such integrated e-fuses.

SUMMARY

Embodiments of the present disclosure provide e-fuses formed of metal that may be integrated in IC devices in a modular manner, thus referred to herein as "e-fuse modules." For example, some embodiments provide e-fuse modules formed in copper damascene interconnect structures of IC devices, and methods for forming such e-fuse modules. The e-fuse modules can be formed at any level of interconnect (e.g., at any metal layer) in the IC device structure.

Some embodiments provide electronic fuse (e-fuse) modules formed in integrated circuit devices. An e-fuse module may include a pair of metal e-fuse terminals (e.g., copper terminals) and an e-fuse element formed directly on the metal e-fuse terminals to define a conductive path between the pair of metal e-fuse terminals through the e-fuse element. The metal e-fuse terminals may be formed in a metal interconnect layer, along with various interconnect elements of the integrated circuit device. The e-fuse element may be formed by depositing and patterning a diffusion barrier layer over the metal e-fuse terminals and interconnect elements formed in the metal interconnect layer. The e-fuse element may be formed from a material that provides a barrier against metal diffusion (e.g., copper diffusion) from each of the metal e-fuse terminals. For example, in some embodiments, the e-fuse element may be formed from titanium tungsten (TiW) or titanium tungsten nitride (TiW$_2$N), which may be particularly effective as both an e-fuse element and a metal diffusion barrier. In other embodiments, the e-fuse element may be formed from nichrome (NiCr), titanium nitride (TiN), or tantalum nitride (TaN).

Thus, the e-fuse element may (a) act as fusible (breakable) element for the e-fuse module, and (b) act as a diffusion barrier for the underlying metal e-fuse terminals. In some embodiments, a supplemental diffusion barrier, e.g., comprising a layer of SiN, SiC, or other dielectric material, may be formed over the e-fuse element, to supplement the diffusion barrier functionality of the e-fuse element.

In some embodiments an e-fuse module as disclosed herein may provide a resistance in the range of 100 ohms to 1,000 ohms, e.g., about 500 ohms, in a low resistance state, and a resistance in the range of 100 KΩ and 100 MΩ, e.g., about 1 MΩ in a high resistance state. In some embodiments, the e-fuse module may have a resistance in the range of 300-500Ω in the low resistance state, and a resistance of greater than 1 MΩ in the high resistance state.

One aspect provides a method of forming an e-fuse module in an integrated circuit structure. A pair of metal e-fuse terminals are formed spaced apart from each other in the integrated circuit structure, wherein the pair of metal e-fuse terminals are connected to semiconductor circuitry, e.g., including transistors and programming control circuitry. An e-fuse element is formed directly on the pair of metal e-fuse terminals to define a conductive path between the pair of metal e-fuse terminals through the e-fuse element, the e-fuse element comprising a conductive material that provides a barrier against metal diffusion from the metal e-fuse terminals.

In some embodiments, the e-fuse element is formed from TiW or $TiW_2N$. In other embodiments, the e-fuse element is formed from NiCr, TiN, or TaN.

In some embodiments, the pair of metal e-fuse terminals are formed in a common metal layer.

In some embodiments, the pair of metal e-fuse terminals comprise copper e-fuse terminals. For example, in some embodiments the metal e-fuse terminals are formed using a copper damascene process.

In some embodiments, the e-fuse element fully covers a top surface of each metal e-fuse terminal.

In some embodiments, a dielectric barrier layer is formed on the e-fuse element, e.g., to supplement the diffusion barrier functionality of the e-fuse element. In some embodiments, the dielectric barrier layer formed on the e-fuse element comprises SiC or SiN.

Another aspect provides a method of forming an integrated circuit structure. A plurality of metal structures are formed in a metal layer, the plurality of metal structures defining a pair of metal e-fuse terminals and a metal interconnect element. An e-fuse/barrier layer is deposited on the plurality of metal structures, the e-fuse/barrier layer comprising a conductive material that provides a barrier against metal diffusion. The e-fuse/barrier layer may be patterned to define (a) an e-fuse element in contact with the pair of metal e-fuse terminals, the e-fuse element providing a conductive path between the metal e-fuse terminals through the e-fuse element to define an e-fuse module, and (b) an interconnect diffusion barrier region on the metal interconnect element.

In some embodiments, the e-fuse/barrier layer comprises TiW or $TiW_2N$. In other embodiments, the e-fuse/barrier layer comprises NiCr, TiN, or TaN.

In some embodiments, forming the plurality of metal structures in the metal layer comprises forming a plurality of copper trench elements in a copper interconnect layer. In some embodiments, the copper trench elements are formed as copper damascene structures.

In some embodiments, the e-fuse element provides a barrier against metal diffusion from the pair of metal e-fuse terminals.

In some embodiments, a dielectric barrier layer, e.g., comprising SiC or SiN, is formed on the e-fuse/barrier layer before patterning the e-fuse/barrier layer, and the dielectric barrier layer is patterned and etched together with the e-fuse/barrier layer. The dielectric barrier layer may supplement the diffusion barrier functionality of the e-fuse/barrier layer. In other embodiments, a dielectric barrier layer, e.g., comprising SiC or SiN, is formed on the e-fuse/barrier layer after patterning and etching the e-fuse/barrier layer.

Another aspect provides an integrated circuit structure including (a) a plurality of metal structures formed in a common metal layer, the plurality of metal structures including a pair of metal e-fuse terminals, and (b) a patterned e-fuse/barrier layer formed on the plurality of metal structures, the patterned e-fuse/barrier layer comprising a conductive material that provides a barrier against metal diffusion. The patterned e-fuse/barrier layer includes an e-fuse element in contact with the pair of metal e-fuse terminals, the e-fuse element (a) providing a conductive path between the metal e-fuse terminals through the e-fuse element to define an e-fuse module, and (b) provides a barrier against metal diffusion from the pair of metal e-fuse terminals.

In some embodiments, the plurality of metal structures formed in the common metal layer further includes a metal interconnect element laterally spaced apart from the pair of metal e-fuse terminals, and the patterned e-fuse/barrier layer further includes an interconnect diffusion barrier region formed on the metal interconnect element.

In some embodiments, the patterned e-fuse/barrier layer comprises TiW or $TiW_2N$. In other embodiments, the patterned e-fuse/barrier layer comprises NiCr, TiN, or TaN.

In some embodiments, the integrated circuit structure also includes a dielectric barrier layer formed on the patterned e-fuse/barrier layer, e.g., to supplement the diffusion barrier functionality of the e-fuse/barrier layer.

BRIEF DESCRIPTION OF THE DRAWINGS

Example aspects of the present disclosure are described below in conjunction with the figures, in which:

FIGS. 3A-7 show an example process for forming an integrated circuit structure including an e-fuse module with an e-fuse element that provides a diffusion barrier for underlying metal e-fuse terminals, according to one example embodiment;

FIGS. 8A-12 show an example process for forming an integrated circuit structure including an e-fuse module with an e-fuse element that provides a diffusion barrier for underlying metal e-fuse terminals, along with a supplemental dielectric barrier layer, according to one example embodiment.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present disclosure provide electronic fuse (e-fuse) modules formed in integrated circuit devices, and methods for forming such e-fuses. In some embodiments, an e-fuse module may include a pair of metal e-fuse terminals (e.g., copper terminals) and an e-fuse element formed directly on the metal e-fuse terminals to define a conductive path between the pair of metal e-fuse terminals through the e-fuse element. The metal e-fuse terminals may be formed in a metal interconnect layer, along with various interconnect elements of the integrated circuit device. The e-fuse element may be formed by depositing and patterning a diffusion barrier layer over the metal e-fuse terminals and interconnect elements formed in the metal interconnect layer. The diffusion barrier layer forming the e-fuse element may be formed from a material that provides a barrier against metal diffusion (e.g., copper diffusion) from each of the metal e-fuse terminals and interconnect elements. For example, in some embodiments, the e-fuse element may be formed from titanium tungsten (TiW) or titanium tungsten nitride ($TiW_2N$), which may be particularly effective as both an e-fuse element and a metal diffusion barrier. In other embodiments, the e-fuse element may be formed from nichrome (NiCr), titanium nitride (TiN), or tantalum nitride (TaN).

Statements and references herein regarding a particular structure providing a barrier against metal diffusion from another structure (e.g., in the context of the disclosed e-fuse/barrier layer, or an e-fuse element or interconnect diffusion barrier region formed from the e-fuse/barrier layer, providing a barrier against metal diffusion from metal e-fuse terminals or interconnect elements) means the particular structure provides at least a partial barrier against metal diffusion from the other structure. For example, a structure providing a barrier against metal diffusion may provide functional reliability for the relevant device (e.g., e-fuse module or device including the e-fuse module) over a 10 year period at normal device operating temperatures (−40° C. to 125° C.).

Figure 1A:
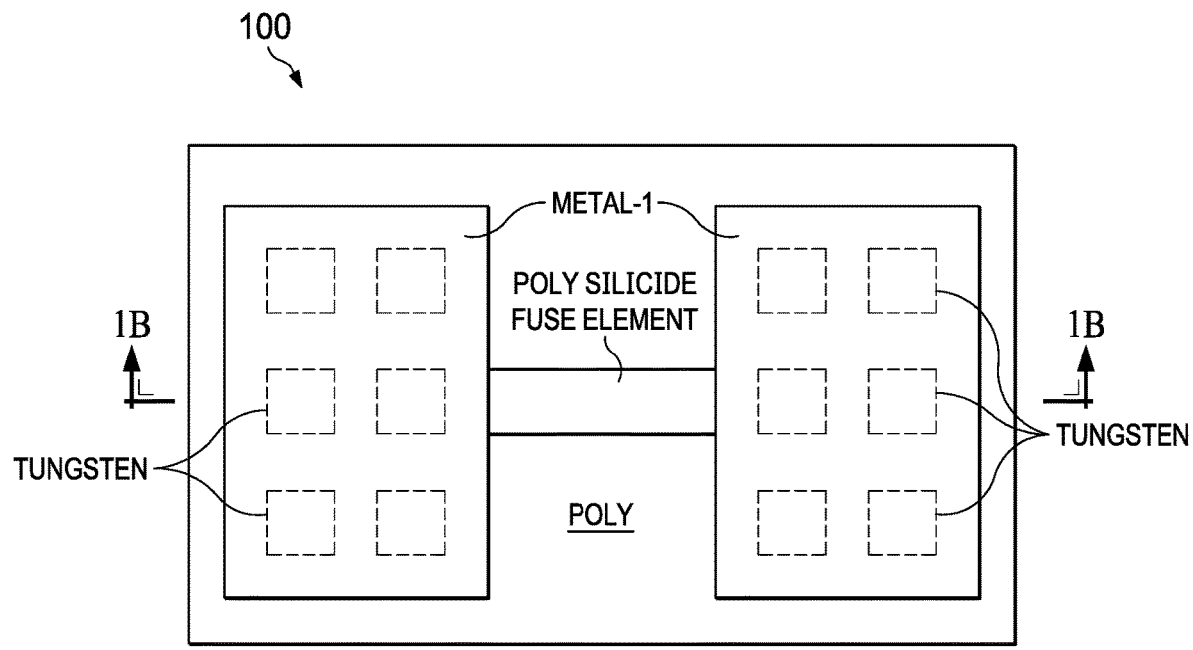
FIGS. 1A and 1B shows a top view and side cross-sectional view, respectively, of a conventional silicide polysilicon e-fuse.
Figure 1B:
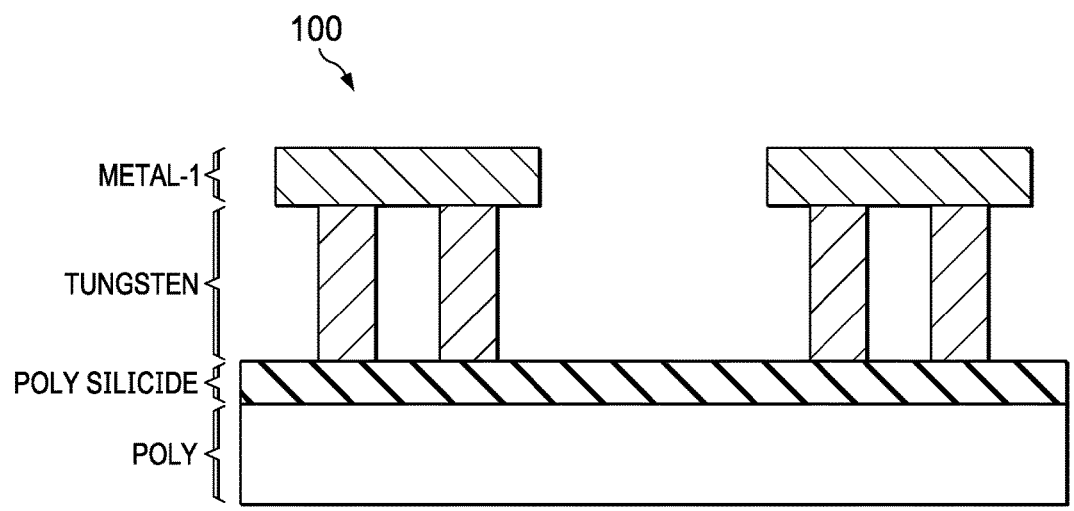
Figure 2:
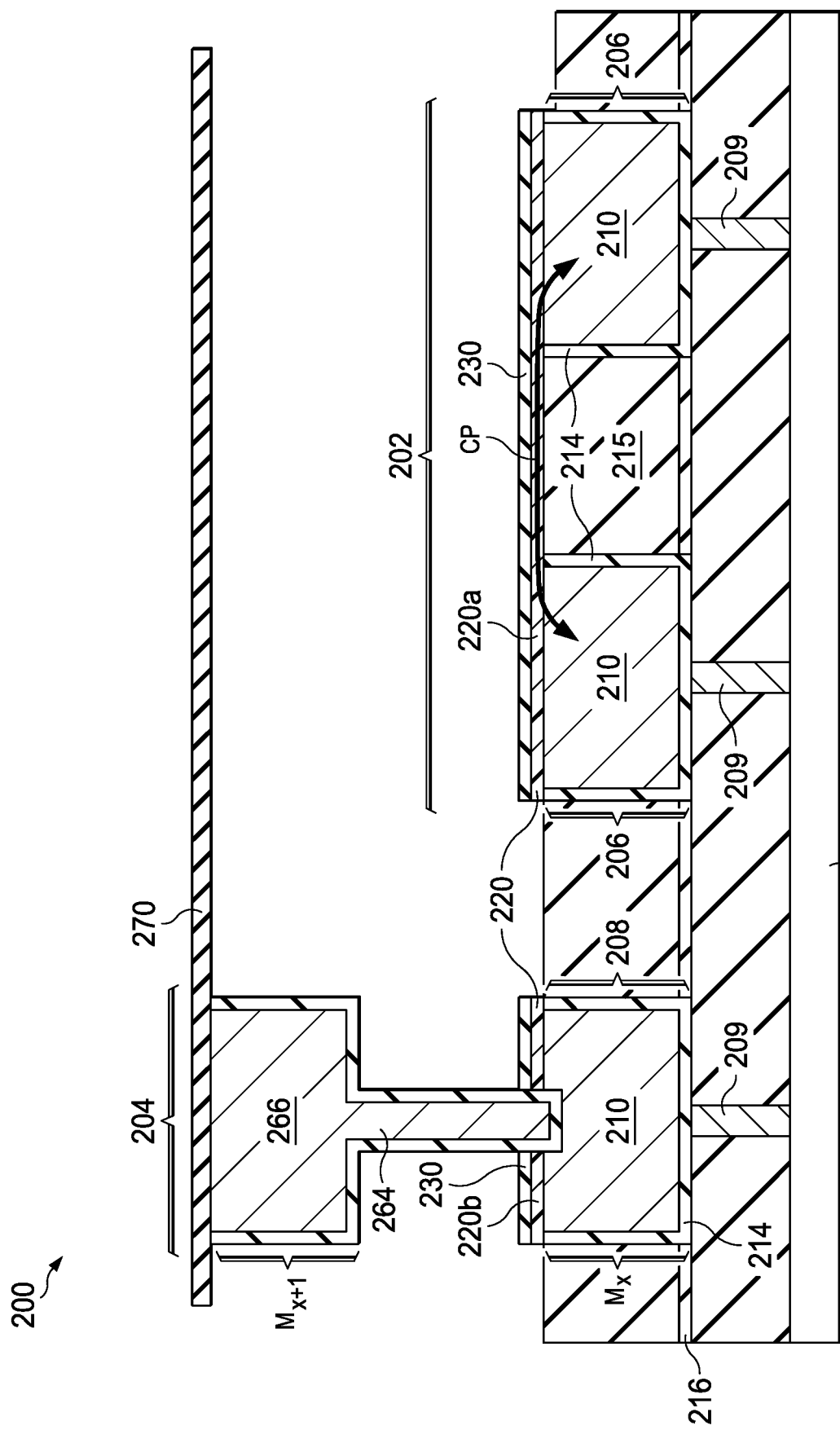
FIG. 2 illustrates an integrated circuit structure including an e-fuse module with an e-fuse element that provides a diffusion barrier for underlying metal e-fuse terminals, according to one example embodiment of the present disclosure.

FIG. 2 illustrates an example IC structure 200 including an e-fuse module 202 along with a nearby interconnect structure 204, formed according to one embodiment of the present disclosure. As shown, the e-fuse module 202 includes an e-fuse element 220a connecting a pair of e-fuse terminals 206 with each other, and the interconnect structure 204 may include (among other elements) a lower interconnect structure 208 and an upper interconnect structure 266. The e-fuse terminals 206 and lower interconnect structure 208 may be formed over and electrically connected to various semiconductor circuitry 205, e.g., including transistors and programming control circuitry, by respective contact vias 209 formed prior to the e-fuse terminals 206 and lower interconnect structure 208.

E-fuse terminals 206 and lower interconnect structure 208 may each comprise a metal structure 210 formed in a common metal interconnect layer $M_x$ (where x refers the level of interconnect metal in the IC structure 200), at any depth in the IC structure 200. For example, metal structures 210 may comprise copper trench elements formed in a copper interconnect layer $M_x$, for example using a damascene process. In some embodiments, e.g., where the e-fuse module 202 is used for programming by a group of transistors, it may be beneficial to form the e-fuse module 202 as close as possible to the semiconductor circuitry 205 (including transistors), to drive the required program current (e.g., 1-10 mA) to "burn" the e-fuse element 220a without causing negative side effects, for example voltage drop due to interconnect resistance, Joule heating, or electromigration. Thus, in some embodiments the e-fuse terminals 206 may be formed in the metal 1 layer (x=1) or metal 2 layer (x=2).

Each metal structure 210 may be formed over a barrier layer 214 (e.g., a Ta/TaN bilayer) deposited in a respective trench formed in a dielectric region 215. In some embodiments, the trench elements 210 may be formed by a Cu damascene process, in which trenches are etched in the dielectric region 215 down to an etch stop layer 216, e.g., a silicon nitride etch stop layer. Material forming barrier layer 214 (e.g., Ta/TaN bilayer) is deposited over the structure and down into the trenches, followed by copper deposition over the dielectric region 215 and extending down into the trench openings and onto the barrier layer 214. The Cu damascene process may be completed with a chemical mechanical polishing (CMP) process to remove unwanted copper at the top of the structure.

In addition to conductively connecting the pair of e-fuse terminals 206 with each other, the e-fuse element 220a acts as a barrier against metal diffusion from e-fuse terminals 206 (e.g., copper diffusion from copper e-fuse terminals 206). In some embodiments, the e-fuse element 220a is formed by (a) depositing an e-fuse/barrier layer 220 over the e-fuse terminals 206 and lower interconnect structure 208, and (b) patterning the e-fuse/barrier layer 220 to define (i) the e-fuse element 220a extending across the tops of the e-fuse terminals 206 (and also acting as a diffusion barrier for the e-fuse terminals 206) and (ii) an interconnect diffusion barrier region 220b on top of the lower interconnect structure 208.

Thus, the e-fuse/barrier layer 220—which forms e-fuse element 220a and interconnect diffusion barrier region 220b—may comprise material(s) suitable for both (a) providing an effective electrical contact (e.g., having a contact resistance less than 1 ohm, or in some implementations less than 0.1 ohm) between the e-fuse element 220a and each e-fuse terminal 206 and (b) acting as a diffusion barrier for underlying metal structures 210, either alone or in combination with a supplemental dielectric barrier layer 230 (discussed below). For example, in some embodiments, the e-fuse/barrier layer 220 may comprise or consist of TiW or $TiW_2N$, which may be particularly effective as both an e-fuse material and metal diffusion barrier. In other embodiments, the e-fuse/barrier layer 220 may comprise or consist of NiCr, which may be less effective as a diffusion barrier in some implementations. In other embodiments, the e-fuse/barrier layer 220 may comprise or consist of TiN or TaN, which may be less effective as an e-fuse material in some implementations.

In some embodiments, a supplemental dielectric barrier layer 230 (e.g., comprising silicon nitride or silicon oxide) may be formed over the e-fuse/barrier layer 220, thus covering the e-fuse element 220a and interconnect diffusion barrier region 220b on lower interconnect structure 208. The supplemental dielectric barrier layer 230 may be optional, e.g., depending on (a) the sufficiency of the e-fuse/barrier layer 220 as a diffusion barrier for the underlying metal structures 210, e.g., for providing relevant target performance characteristics, or (b) etch stop requirements for building the next level of interconnect structure, as defined by the relevant design specification, and/or other relevant considerations.

FIGS. 3A-7 discussed below show an example embodiment in which the e-fuse/barrier layer 220 acts alone as a diffusion barrier for the underlying metal structures 210, without the supplemental dielectric barrier layer 230, e.g., in view of the considerations discussed above. This may provide an advantage, as the supplemental dielectric barrier layer 230 may have a relatively high dielectric constant that may increase interconnect RC delay and thus reduce relevant device the performance (e.g., speed). For example, dielectric barrier layer 230 may be formed from SiN having a dielectric constant of about 7, or SiC having a dielectric constant in the range of about 4.3 to 5.5, both substantially higher than low-k dielectrics having a typical dielectric constant typically of less than 3.6.

In contrast, FIGS. 8A-12 discussed below show an example embodiment including a supplemental dielectric barrier layer 230 (e.g., comprising SiN or SiC) formed over the e-fuse/barrier layer 220, and selectively etched between the metal structures 210 to avoid an increased interconnect RC delay and a resulting reduction in device performance (e.g., speed). Finally, FIGS. 13A-15 discussed below show an example embodiment including a supplemental dielectric barrier layer 230 (e.g., SiN or SiC) formed over the e-fuse/barrier layer 220 and left intact (e.g., without being selectively etched), for example to simplify the manufacturing process.

Referring to FIG. 2, lower interconnect structure 208 may connect to interconnect circuitry in other metal layer(s). For example, in the example shown in FIG. 2, the lower interconnect structure 208 may be connected to an upper interconnect structure 266 formed in a metal layer $M_{x+1}$ by an interconnect via 264. In the illustrated embodiment, upper interconnect structure 266 and via 264 are formed as a Cu dual damascene structure. A dielectric barrier layer 270 may be formed over metal layer $M_{x+1}$.

In some embodiments, the e-fuse/barrier layer 220 (and thus e-fuse element 220a and interconnect diffusion barrier region 220b) may comprise TiW or $TiW_2N$, and may have a sheet resistance Rs in the range of 5-1000 Ω/square, or 5-100 Ω/square, or 10-30 Ω/square, or about 15 Ω/square. In some embodiments, the e-fuse/barrier layer 220 may have a thickness in the range of 250 Å-750 Å, or 400 Å-600 Å, or about 500 Å. In the low resistance state, the e-fuse element 220a may have a resistance in the range of 100 ohms to 1,000 ohms, e.g., about 500 ohms, and in the high resistance state a resistance in the range of 100 KΩ and 100 MΩ, e.g., about 1 MΩ. In some embodiments, the e-fuse element 220a may have a resistance in the range of 50-300Ω, or 75-150Ω, or about 100Ω in the low resistance state, and a resistance of greater than 1 MΩ in the high resistance state.

Although metal layers $M_x$ and $M_{x+1}$ may comprise copper as discussed above, in other embodiments metal layer $M_x$ and/or $M_{x+1}$ (and thus e-fuse terminals 206, lower interconnect element 208, and/or upper interconnect element 266) may be formed from other metal(s), for example iridium (Ir), rhodium (Rh), ruthenium (Ru), or cobalt (Co). The various barrier layers, for example e-fuse/barrier layer 220, the optional dielectric barrier layer 230, and/or dielectric barrier layer 270 may be adjusted accordingly, i.e. the constituent elements thereof, based on the selected interconnect metal.

Figure 7:
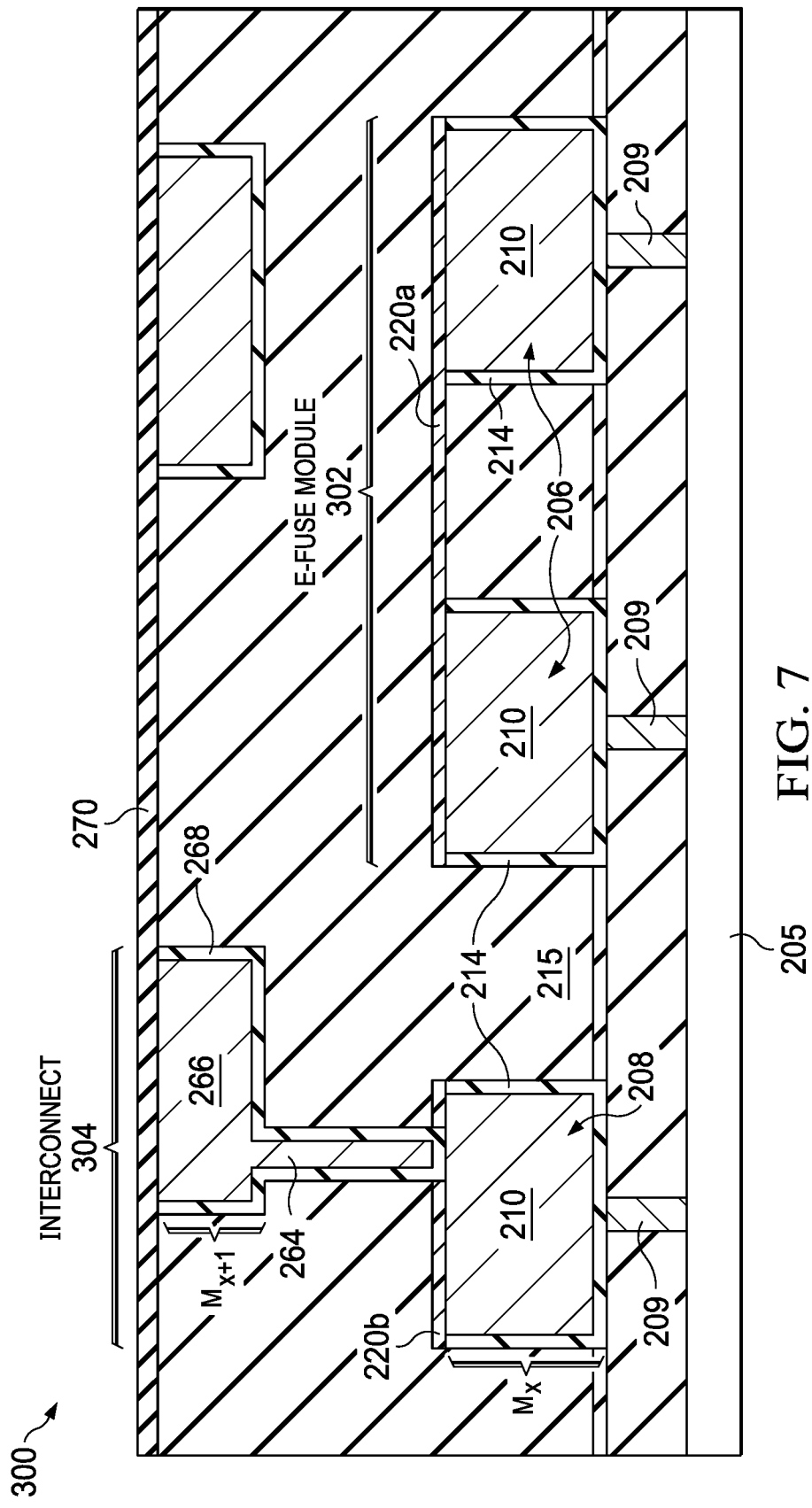

FIGS. 3A-7 show an example process for forming an e-fuse module 302 along with a nearby interconnect structure 304 in an example IC structure 300, according to one embodiment of the present disclosure. E-fuse module 302 and interconnect structure 304 formed according to the process shown in FIGS. 3A-7 may correspond with e-fuse module 202 and interconnect structure 204, respectively, shown in FIG. 2. Each pair of figures sharing the same figure number, namely FIGS. 3A and 3B, FIGS. 4A and 4B, FIGS. 5A and 5B, and FIGS. 6A and 6B, shows a similar top view and a cross-sectional side view, respectively, of the example IC structure 300 being constructed, in which the cross-sectional side view is taken through a cut line indicated in the top view. For example, FIG. 3B shows a cross-sectional side view taken through line 3B-3B shown in the top view FIG. 3A, FIG. 4B shows a cross-sectional side view taken through line 4B-4B shown in the top view FIG. 4A, etc. FIG. 7 shows a cross-sectional side view of the completed example IC structure 300, comprising e-fuse module 302 and interconnect 304.

As shown in FIGS. 3A and 3B, the IC structure 300 may include metal structures 210 formed in metal layer $M_x$ in a dielectric region 215 formed above semiconductor circuitry 205, e.g., including transistors and programming control circuitry. Metal structures 210 may define (a) a pair of e-fuse terminals 206 for the e-fuse module 302 being constructed and (b) a lower interconnect structure 208 for the interconnect structure 304. Metal structures 210 may be connected to selected semiconductor circuitry 205, e.g., by respective contact vias 209 formed prior to the metal structures 210. In one example embodiment metal structures 210 are formed of Cu.

Each metal structure 210 may be formed over a barrier layer 214 (e.g., a Ta/TaN bilayer) deposited in a respective trench opening. In one embodiment, the metal structures 210 may be trench elements formed by a Cu damascene process in which Cu is deposited over dielectric region 215 and extends down into trench openings formed in dielectric region 215, followed by CMP process to remove unwanted Cu at the top of the structure. Dielectric region 215 may include one or more dielectric materials, e.g., at least one of silicon oxide, fluorosilicate glass (FSG), organosilicate glass (OSG), porous OSG, or other low-k dielectric material, e.g., having a dielectric constant less than 3.6.

After the CMP process, an exposed top surface 225 of each metal structure 210 is typically susceptible to oxidation, for example from the oxygen in the air, moisture in the air, or water residue left from a post CMP clean. Exposure to light may further accelerate such oxidation or corrosion process. Such corrosion can result in yield loss and reliability failure of the resulting IC device. Thus, it may be beneficial to protect the upper surface of each metal structure 210 soon after the CMP to reduce this corrosion risk.

Figure 4A:
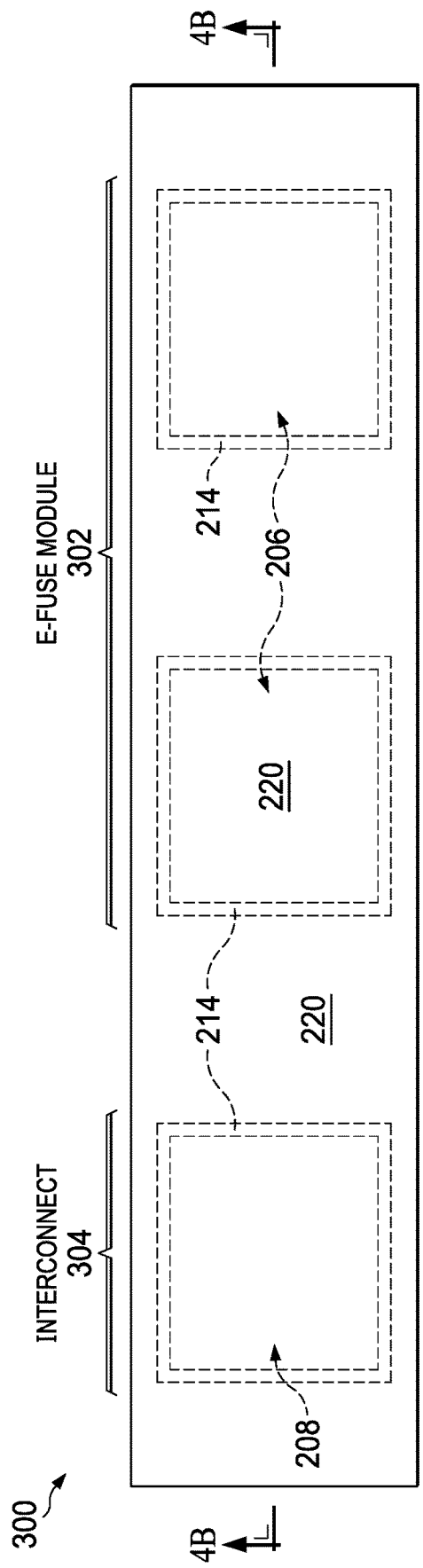
Figure 4B:
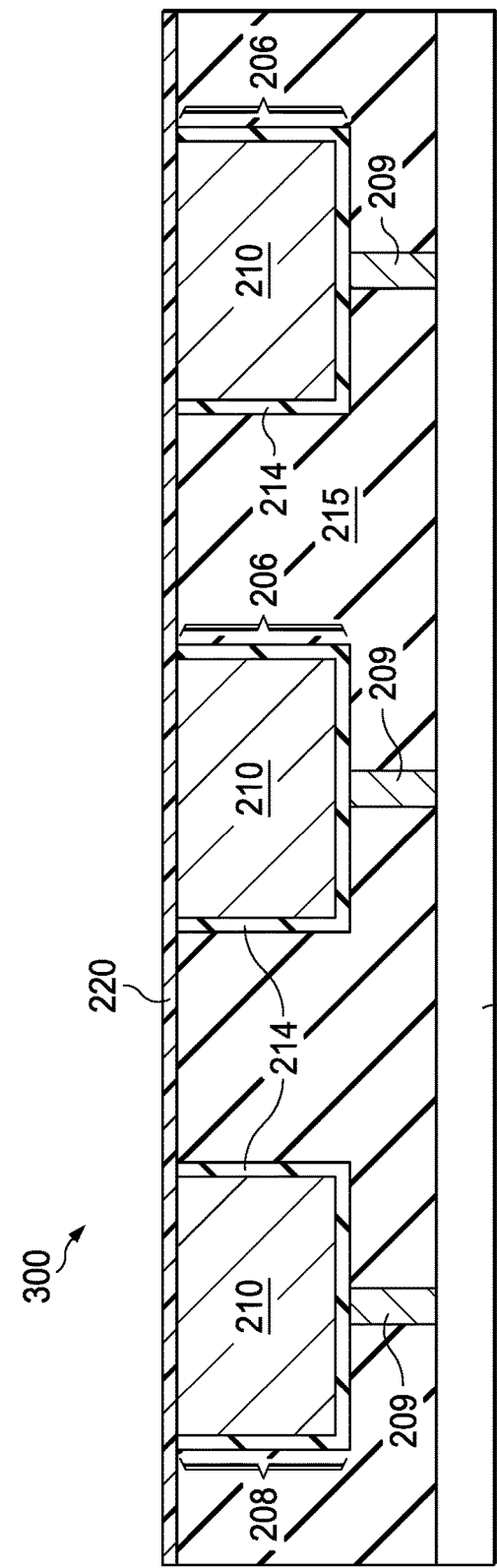

Next, as shown in FIGS. 4A and 4B, an e-fuse/barrier layer 220 is deposited over the structure, for example covering the full semiconductor wafer. The e-fuse/barrier layer 220 may be deposited directly onto the e-fuse terminals 206 and lower interconnect structure 208. The e-fuse/barrier layer 220 may be deposited by physical vapor deposition (PVD) or other suitable deposition technique. Generally, the e-fuse/barrier layer 220 may comprise a material, or a combination of materials, that are (a) suitable for acting as a fusible e-fuse element between the e-fuse terminals 206 (i.e. conductive) and (b) suitable to act as a diffusion barrier for the underlying metal structures 210. For example, in some embodiments, the e-fuse/barrier layer 220 may comprise or consist of TiW or $TiW_2N$, which may be particularly effective as a diffusion barrier, and is sufficiently conductive to serve as a fusible e-fuse element. In other embodiments, e-fuse/barrier layer 220 may comprise or consist of NiCr, TiN, or TaN. Example characteristics of the e-fuse/barrier layer 220 are discussed in further detail below with reference to FIGS. 6A and 6B.

Next, as shown in FIGS. 5A and 5B, a photoresist mask (photomask) 240 is formed and patterned over the e-fuse/barrier layer 220. The patterned photomask 240 may include (a) an e-fuse patterning region 242 including a respective terminal region 244 over each e-fuse terminal 206 and a connecting region 246 connecting the two terminal regions 244, and (b) an interconnect patterning region 243 covering the lower interconnect structure 208. The connecting region 246 may have a narrowed, high-resistance "neck" portion 248 that defines a bowtie or hourglass shape of the connecting region 246. A width $W_{NR}$ of the neck portion 248 may be less than a width $W_{TR}$ of each terminal region 244, for example less than 90%, less than 75%, less than 60%, less than 50%, less than 30%, or less than 20% the width $W_{TR}$ of each terminal region 244. The width $W_{NR}$ of the neck portion 248, along with the length $L_{NR}$ of the neck portion 248, the length $L_C$ of the connecting region 246, and/or the particular shape of the connecting region 246 and neck portion 248, which define the corresponding shape and dimensions of the resulting post-etch e-fuse element 220a as shown in FIGS. 6A-6B discussed below, may be selected to provide desired performance characteristics of the resulting e-fuse module 302, e.g., the resistance value and/or the point of fusing where the conductive path across the e-fuse is broken.

In this embodiment, the patterned photomask 240 fully covers the patterned copper layer $M_x$, or in other words, the patterned photomask 240 covers the full area (from the top view shown in FIG. 5A) of all metal structures 210 in layer $M_x$ on the wafer, including e-fuse terminals 206 and lower interconnect structure 208. Patterning the photomask 240 to fully cover the metal structures 210 in metal layer $M_x$ may provide various advantages, as compared with patterning only an area associated with the e-fuse module 302. For example, in a photolithography process in which the e-fuse pattern density is low (e.g., about 1%), the required photo exposure is typically very high, which may cause the lens to overheat, leading to unwanted process variation. By patterning a much larger percentage of the wafer area (i.e., to cover all of the metal structures 210 in $M_x$ layer), the required photo exposure may be substantially reduced, thus avoid potential lens overheating.

In addition, patterning the larger percentage of the wafer area may substantially reduce the subsequent plasma etch burden (by reducing the area to etch). In addition, the risk of plasma etch penetrating through the e-fuse/barrier layer 220 at the top of each metal structure 210 may be reduced or eliminated. Moreover, by pattering the full copper layer $M_x$, the photomask may be generated in a straightforward manner, e.g., by first reverse tuning the mask used to form the trench layer $M_x$ (e.g., by switching from glass to chrome or from chrome or glass), then performing a logic "OR" of the reverse tuned mask with the e-fuse module pattern.

In some embodiments, a reticle bias (e.g., a positive bias for over-sizing, or negative bias for under sizing) can be added when reverse tuning the mask used to form the trench layer $M_x$. As shown in FIGS. 5A-5B, in some embodiments a slight positive reticle bias, indicated at RB, may be used to provide a photo alignment margin 249 around each underlying metal element 210. If the etched e-fuse/barrier layer 220 experiences metal shorting, the reticle bias RB can be reduced, or a negative bias may even be used, for example where a zero bias on the reticle results in a positive bias on the wafer due to etch bias.

Next, as shown in FIGS. 6A and 6B, an etch may be performed to remove portions of the e-fuse/barrier layer 220 in areas unprotected by the patterned photomask 240. In some embodiments, a plasma etch, or alternatively a wet etch, may be performed. A resist strip and clean process may be performed after the etch.

The resulting portions of e-fuse/barrier layer 220 define (a) an e-fuse element 220a over the e-fuse terminals 206 and over a portion of dielectric region 215 therebetween, and (b) a interconnect diffusion barrier region 220b over the lower interconnect structure 208. The e-fuse element 220a includes (a) a terminal region 350 covering the full area of each e-fuse terminal 206 (corresponding with terminal regions 244 of patterned photomask 240 discussed above), and (b) a connecting region 252 that connects the two terminal regions 350, which connecting region 252 includes a narrowed neck portion 254 (corresponding with the connecting region 246 and neck region 248 of the patterned photomask 240 discussed above). As noted above, the various dimensions and shape of the connecting region 252, including the narrowed neck portion 254, may be selected by controlling the dimensions and shape of the connecting region 246, including neck region 248, of the patterned photomask 240, to provide desired performance characteristics of the resulting e-fuse module 302, e.g., the resistance value and/or the point of fusing where the conductive path across the e-fuse is broken.

The e-fuse element 220a formed on the pair of e-fuse terminals 206 as disclosed above thereby defines a conductive path, indicated by double-headed arrow CP, between the two e-fuse terminals 206. In addition, the e-fuse element 220a acts as a barrier against metal diffusion from e-fuse terminals 206 (e.g., copper diffusion from copper e-fuse terminals 206). Similarly, interconnect diffusion barrier region 220b, also formed from the e-fuse/barrier layer 220, acts as a barrier against metal diffusion from the lower interconnect structure 208.

Thus, the e-fuse/barrier layer 220—which may be patterned to form e-fuse element 220a and interconnect diffusion barrier region 220b as discussed above—exhibits the following properties:

(a) electrically conductive, such that e-fuse element 220a forms an effective electrical contact between the e-fuse terminals 206 (e.g., having a contact resistance less than 1 ohm, or in some implementations less than 0.1 ohm, between e-fuse element 220a and each e-fuse terminal 206);

(b) easily fused or prone to electromigration, such that e-fuse element 220a is fusible under electric current, for example at the narrowed neck portion 254, according to the relevant performance specification; and (c) provides a diffusion barrier for the underlying metal structures 210 (e-fuse terminals 206 and lower interconnect structure 208 layer 230.

For example, in some embodiments, the e-fuse/barrier layer 220 may comprise or consist of TiW or TiW$_2$N, which may be particularly effective as both a fusible e-fuse element and a metal diffusion barrier. In other embodiments, e-fuse/barrier layer 220 may comprise or consist of NiCr, TiN, or TaN.

In addition, e-fuse/barrier layer 220 may be formed with a suitable thickness for providing the various characteristics discussed above. In some embodiments, the e-fuse/barrier layer 220 (and thus e-fuse element 220a and interconnect diffusion barrier region 220b) may have a thickness in the range of 250 Å-750 Å, or 400 Å-600 Å, or about 500 Å and a sheet resistance Rs in the range of 5-1000 Ω/square, or 5-100 Ω/square, or 10-30 Ω/square, or about 15 Ω/square.

In the low resistance state, the e-fuse element 220a may have a resistance in the range of 100 ohms to 1,000 ohms, e.g., about 500 ohms, and in the high resistance state a resistance in the range of 100 KΩ and 100 MΩ, e.g., about 1 MΩ. In some embodiments, the e-fuse element $220a$ may have a resistance in the range of 50-300Ω, or 75-150Ω, or about 100Ω in the low resistance state, and a resistance of greater than 1 MΩ in the high resistance state.

Although metal layers $M_x$ and $M_{x+1}$ may comprise copper as discussed above, in other embodiments metal layer $M_x$ and/or $M_{x+1}$ (and thus e-fuse terminals 206, lower interconnect element 208, and/or upper interconnect element 266) may be formed from other metal(s), for example iridium (Ir), rhodium (Rh), ruthenium (Ru), or cobalt (Co).

Next, as shown in the cross-sectional side view of FIG. 7, interconnect formation may continue, to thereby contact the lower interconnect element 208. For example, lower interconnect element 208 may be contacted by an interconnect via 264 connected to a trench element 266. In the illustrated embodiment, trench element 266 and interconnect via 264 comprise a dual damascene Cu structure, e.g., formed by depositing a barrier layer 268 (e.g., a Ta/TaN bilayer), copper seed, and followed by copper plating, in a dual damascene trench. A copper CMP process is then performed to remove the excess copper. Finally, a dielectric barrier layer 270, e.g., comprising silicon nitride (SiN) or silicon carbide (SiC), without limitation, may be formed over metal layer $M_{x+1}$.

As discussed above, in other embodiments a supplemental dielectric barrier layer (e.g., SiN or SiC) may be formed over the e-fuse/barrier layer 220, e.g., to provide additional protection against diffusion from the underlying metal structures 210, e.g., copper diffusion in embodiments in which metal structures 210 comprise Cu trench structures. In some embodiments, the supplemental dielectric barrier layer may be deposited on the e-fuse/barrier layer 220 prior to etching the e-fuse/barrier layer 220, such that the supplemental dielectric barrier layer is etched along with the underlying e-fuse/barrier layer 220. In other embodiments, the supplemental dielectric barrier layer may be deposited after etching the e-fuse/barrier layer 220 (to define the e-fuse element $220a$ and interconnect diffusion barrier region $220b$ as discussed above) and left intact as a continuous layer extending across the wafer.

FIGS. 8A-12 show an example process for forming an e-fuse module 802 along with a nearby interconnect structure 804 in an example IC structure 800, wherein a supplemental dielectric barrier layer 230 is deposited and etched over the e-fuse/barrier layer 220, according to one embodiment of the present disclosure. IC structure 800 generally corresponds with IC structure 300 shown in FIGS. 3A through 7, but with the addition of the supplemental dielectric barrier layer 230.

Figure 8A:
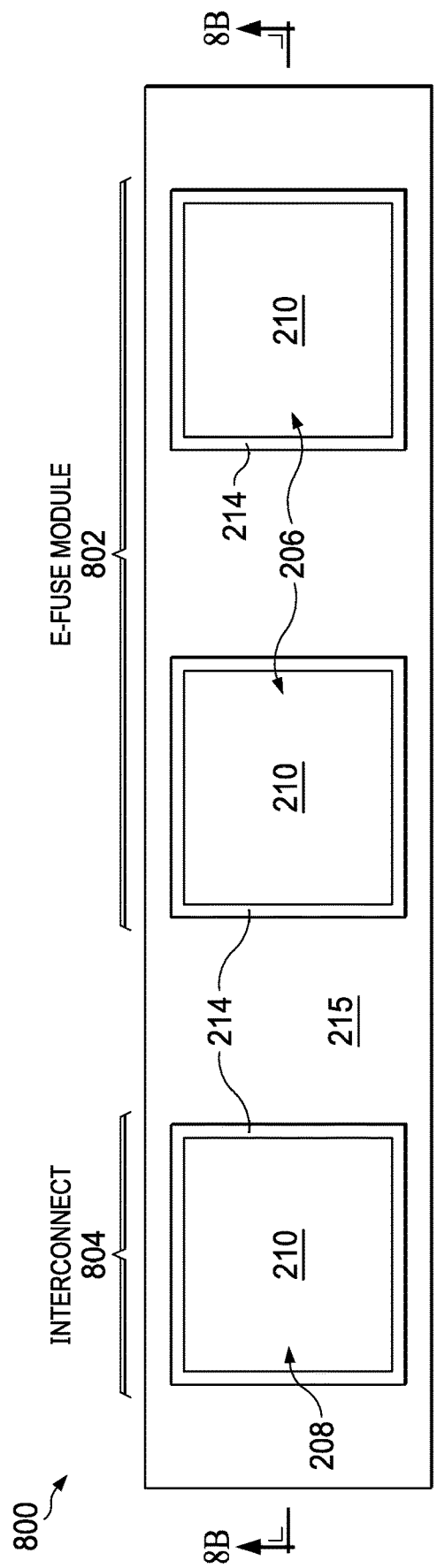
Figure 8B:
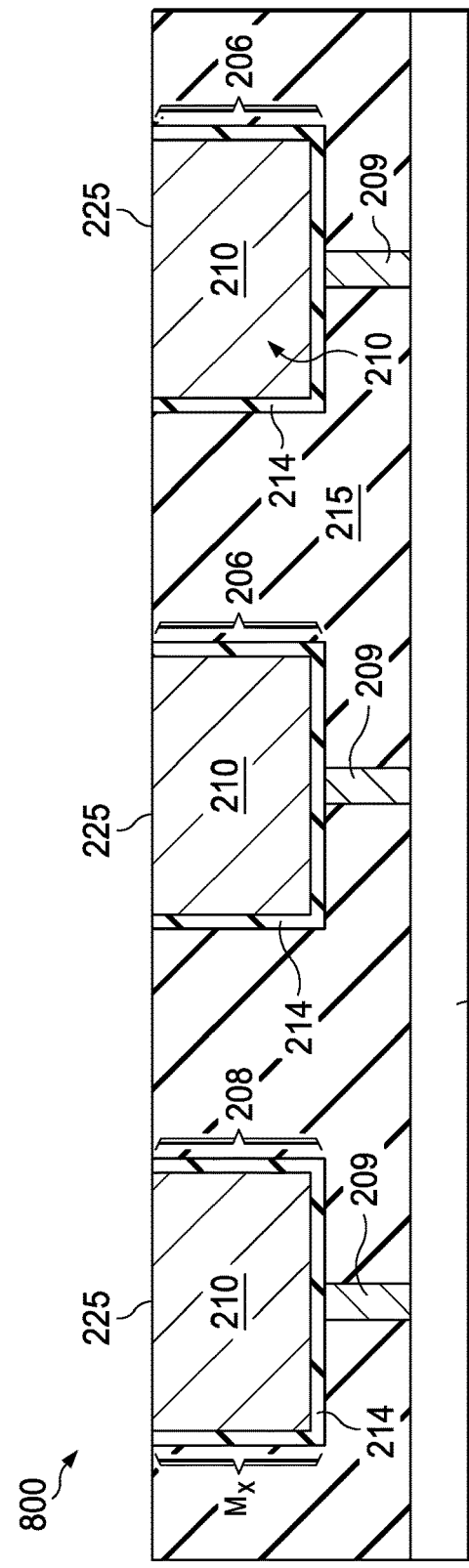

Each pair of figures sharing the same figure number, namely FIGS. 8A and 8B, FIGS. 9A and 9B, FIGS. 10A and 10B, and FIGS. 11A and 11B, shows a similar top view and a cross-sectional side view, respectively, of the example IC structure 800 being constructed, in which the cross-sectional side view is taken through a cut line indicated in the top view. For example, FIG. 8B shows a cross-sectional side view taken through line 8B-8B shown in the top view FIG. 8A, etc. FIG. 12 shows a cross-sectional side view of the completed example IC structure 800, including e-fuse module 802 and interconnect 804.

First, FIGS. 8A and 8B show IC structure 800 corresponding with IC structure 300 shown in FIGS. 3A and 3B, discussed above. Thus, IC structure 800 include metal structures 210 formed in metal layer $M_x$ in a dielectric region 215 formed above semiconductor circuitry 205, e.g., including transistors and programming control circuitry. Metal structures 210 may define (a) a pair of e-fuse terminals 206 for the e-fuse module 802 being constructed and (b) a lower interconnect structure 208 for the interconnect structure 804. Metal structures 210 may be connected to selected semiconductor circuitry 205, e.g., by respective contact vias 209 formed prior to the metal structures 210. In one example embodiment metal structures 210 are formed of Cu. Each metal structure 210 may be formed over a barrier layer 214 (e.g., a Ta/TaN bilayer) deposited in a respective trench opening.

As discussed above, after the CMP process an exposed top surface 225 of each metal structure 210 is typically susceptible to oxidation, for example from the oxygen in the air, moisture in the air, or water residue left from a post CMP clean. Exposure to light may further accelerate such oxidation or corrosion process. Such corrosion can result in yield loss and reliability failure of the resulting IC device. Thus, it may be beneficial to protect the upper surface of each metal structure 210 soon after the CMP to reduce this corrosion risk.

Figure 9A:
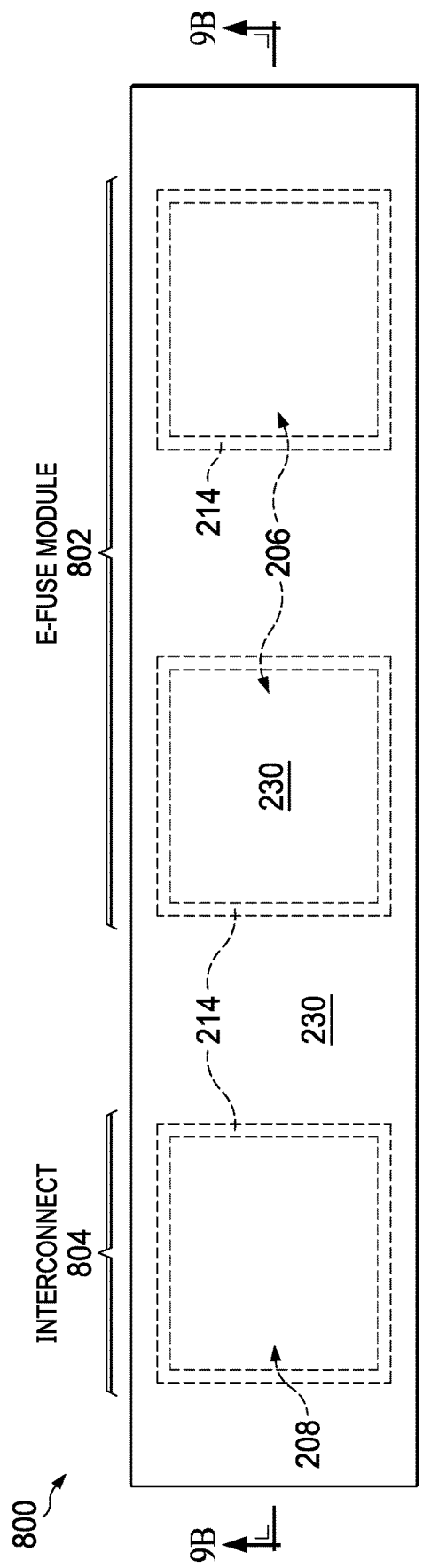
Figure 9B:
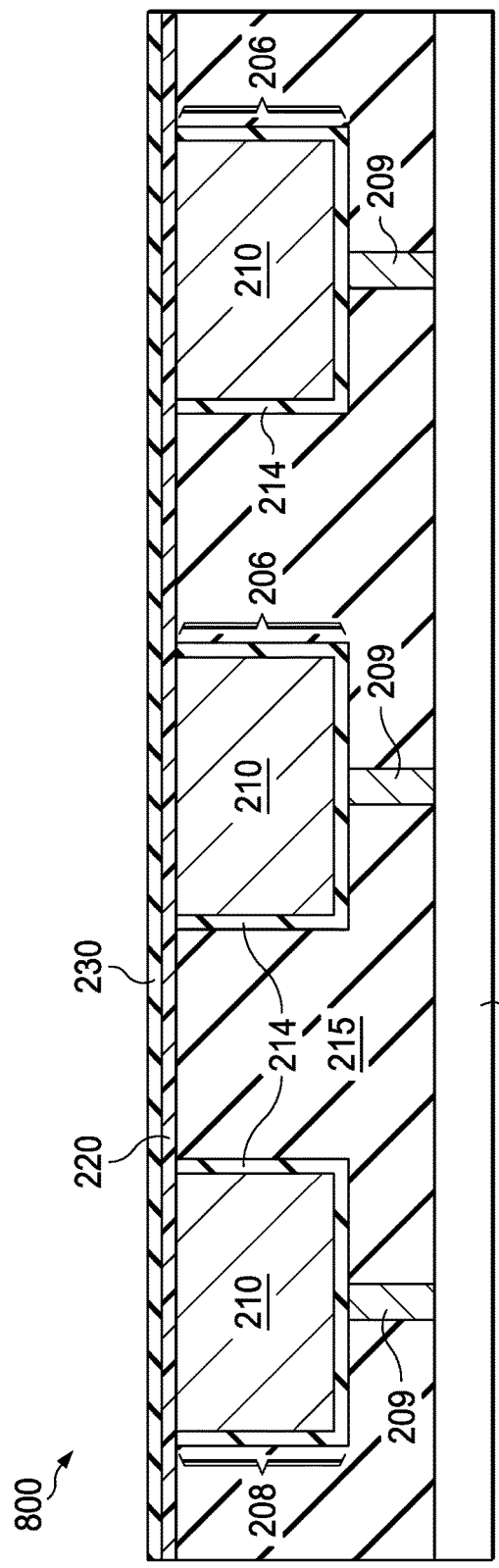

Next, as shown in FIGS. 9A and 9B, an e-fuse/barrier layer 220 is deposited over the structure, followed by deposition of a supplemental dielectric barrier layer 230, for example covering the full semiconductor wafer. The e-fuse/barrier layer 220 may be deposited directly onto the e-fuse terminals 206 and lower interconnect structure 208. The e-fuse/barrier layer 220 may comprise TiW, TiW$_2$N, NiCr, TiN, or TaN, or other suitable material, and may be deposited by physical vapor deposition (PVD) or other suitable technique. The supplemental dielectric barrier layer 230 may comprise SiN or SiC, or other dielectric material that provides additional protection against metal diffusion from underlying metal elements 210. The supplemental dielectric barrier layer 230 may be deposited by Plasma Enhanced Chemical Vapor Deposition (PECVD) or other suitable technique. In some embodiments, the supplemental dielectric barrier layer 230 may have a thickness in the range of 250 Å-1000 Å, or about 500 Å.

Next, as shown in FIGS. 10A and 10B, a photoresist mask (photomask) 240 is formed and patterned over the dielectric barrier layer 230 and underlying e-fuse/barrier layer 220. As discussed above regarding FIGS. 5A and 5B, the patterned photomask 240 may include (a) an e-fuse patterning region 242 including (i) a respective terminal region 244 over each e-fuse terminal 206 and (ii) a connecting region 246, the connecting region 246 having a high-resistance "neck" portion 248, the connecting region 246 connecting the two terminal regions 244, and (b) an interconnect patterning region 243 covering the lower interconnect structure 208.

In this embodiment, the patterned photomask 240 fully covers the patterned copper layer $M_x$, or in other words, the patterned photomask 240 covers the full area (from the top view shown in FIG. 5A) of all metal structures 210 in layer $M_x$ on the wafer, including e-fuse terminals 206 and lower interconnect structure 208. Patterning the photomask 240 to fully cover the metal structures 210 in metal layer $M_x$ may provide various advantages, as discussed above regarding FIGS. 5A and 5B. Further, as discussed above, the photomask may be formed with a positive or negative reticle bias, according to relevant process specification. Due to the provision of supplemental dielectric barrier layer 230, a negative reticle bias may be easily achieved without concern over copper diffusion.

Figure 11A:
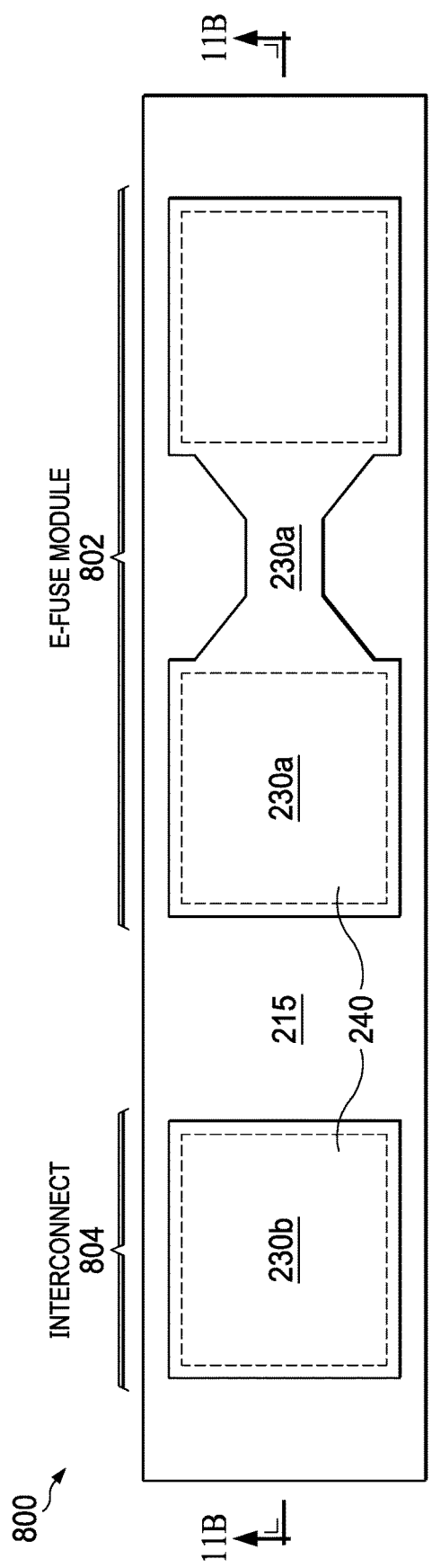
Figure 11B:
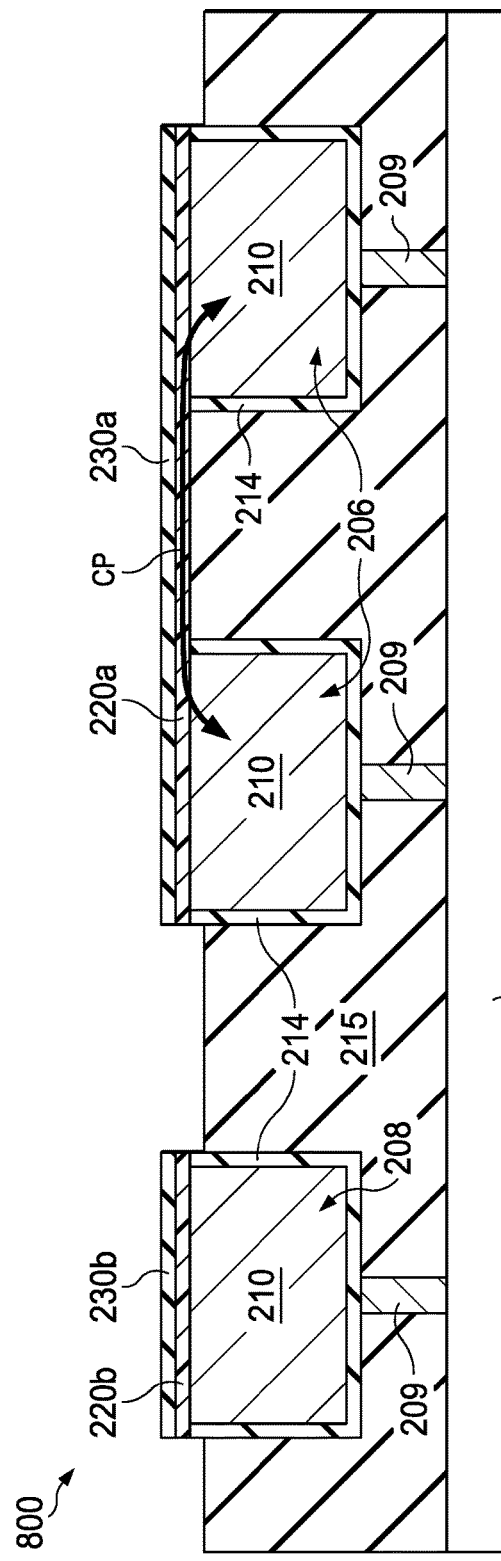
Figure 12:
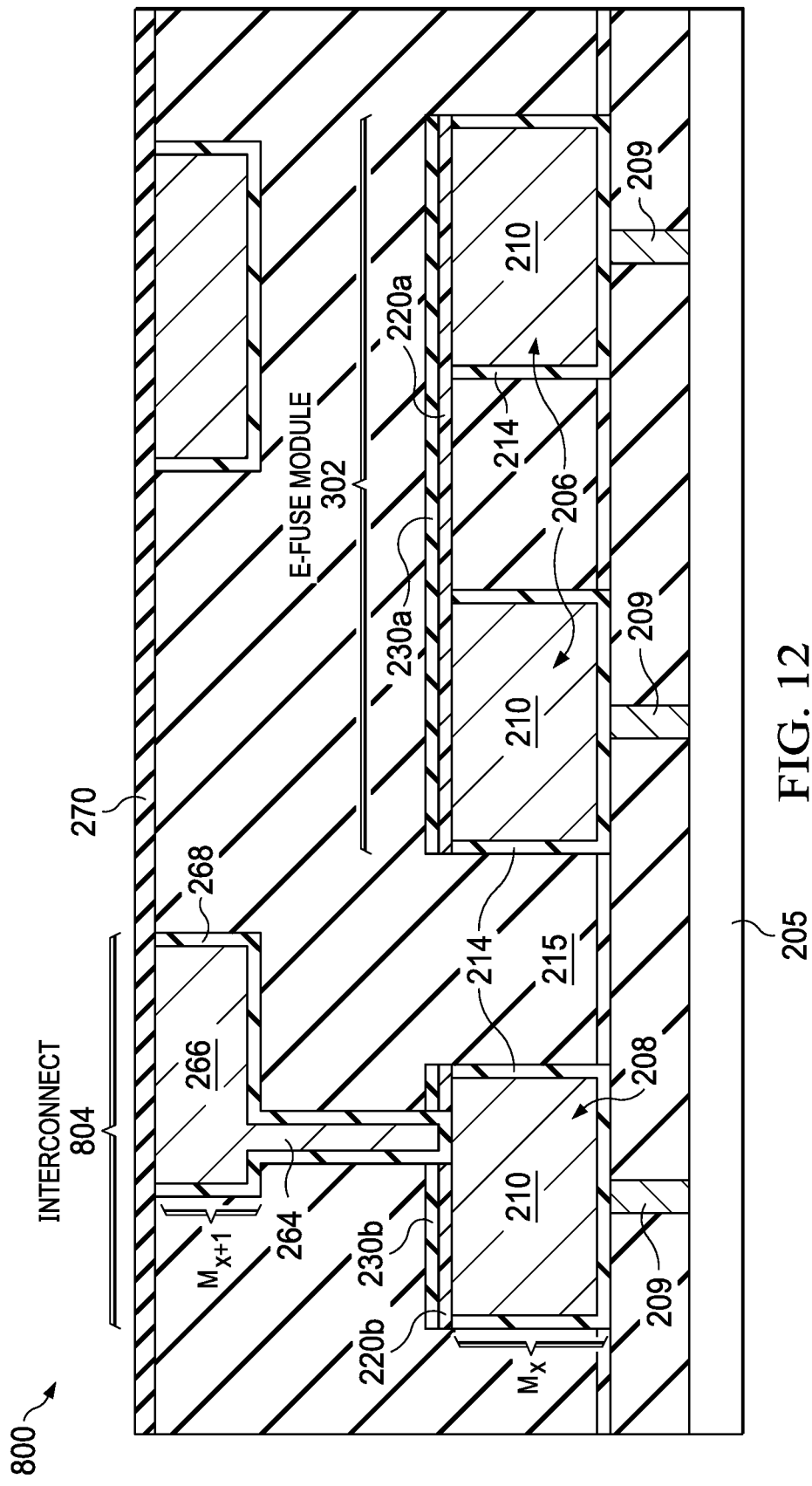

Next, as shown in FIGS. 11A and 11B, an etch may be performed to remove portions of the dielectric barrier layer 230 and underlying e-fuse/barrier layer 220 in areas unprotected by the patterned photomask 240. In some embodiments, a plasma etch, or alternatively a wet etch, may be performed. A resist strip and clean process may be performed after the etch.

The resulting portions of the dielectric barrier layer 230 and e-fuse/barrier layer 220 define (a) an e-fuse element 220a with an overlying e-fuse dielectric cap 230a over the e-fuse terminals 206 and over a portion of dielectric region 215 therebetween, and (b) an interconnect diffusion barrier region 220b with an overlying interconnect dielectric cap 230b over the lower interconnect structure 208. The e-fuse element 220a defines a conductive path CP between the two e-fuse terminals 206, and acts as a barrier, in cooperation with overlying e-fuse dielectric cap 230a, against metal diffusion from e-fuse terminals 206. Similarly, interconnect diffusion barrier region 220b, in cooperation with overlying interconnect dielectric cap 230b, acts as a barrier against metal diffusion from the lower interconnect structure 208. As indicated, the e-fuse dielectric cap 230a and interconnect dielectric cap 230b supplement the diffusion blocking functionality provided by the respective e-fuse element 220a and interconnect diffusion barrier region 220b formed from the e-fuse/barrier layer 220 as discussed above.

Next, as shown in the cross-sectional side view of FIG. 12, interconnect formation may continue, to thereby contact the lower interconnect element 208. For example, lower interconnect element 208 may be contacted by an interconnect via 264 connected to a trench element 266. In the illustrated embodiment, trench element 266 and interconnect via 264 comprise a dual damascene Cu structure, e.g., formed by depositing a barrier layer 268 (e.g., a Ta/TaN bilayer), copper seed, and followed by copper plating, in a dual damascene trench. A copper CMP process is then performed to remove the excess copper. Finally, a dielectric barrier layer 270, e.g., comprising silicon nitride (SiN) or silicon carbide (SiC), without limitation, may be formed over metal layer $M_{x+1}$.

As discussed above, in other embodiments a supplemental dielectric barrier layer may be deposited after etching the e-fuse/barrier layer 220 (to define the e-fuse element 220a and interconnect diffusion barrier region 220b as discussed above) and left intact as a continuous layer extending across the wafer. FIGS. 13A-15 show an example process for forming an e-fuse module 1302 along with a nearby interconnect structure 1304 in an example IC structure 1300, wherein a supplemental dielectric barrier layer 230 is deposited after etching the e-fuse/barrier layer 220 and left intact, according to one embodiment of the present disclosure.

Figure 13A:
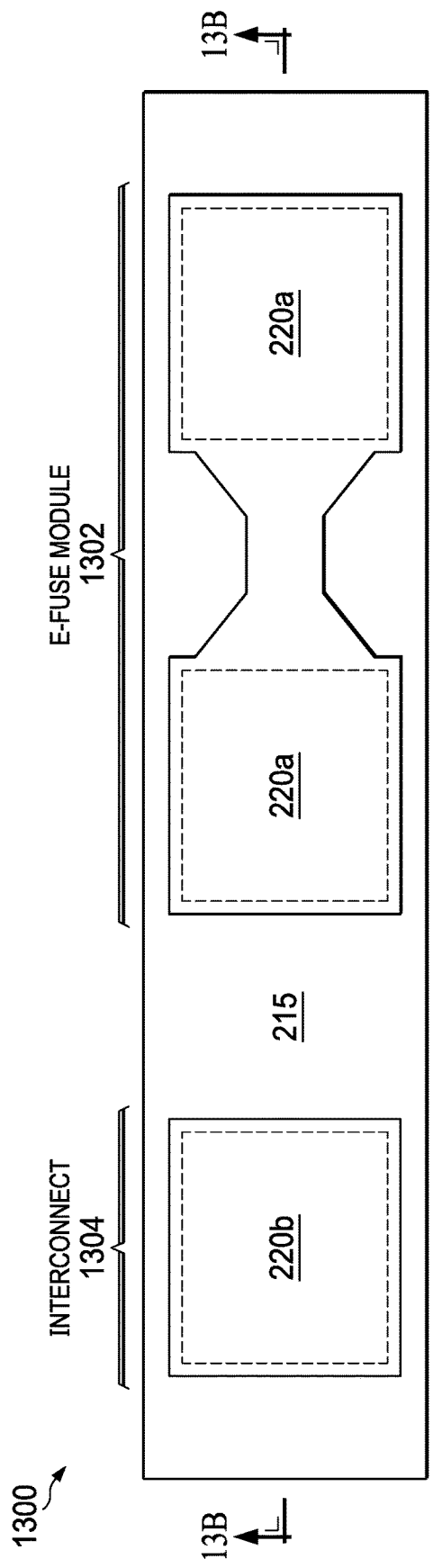
FIGS. 13A-15 show an example process for forming an integrated circuit structure including an e-fuse module with an e-fuse element that provides a diffusion barrier for underlying metal e-fuse terminals, along with a supplemental dielectric barrier layer, according to another example embodiment.
Figure 13B:
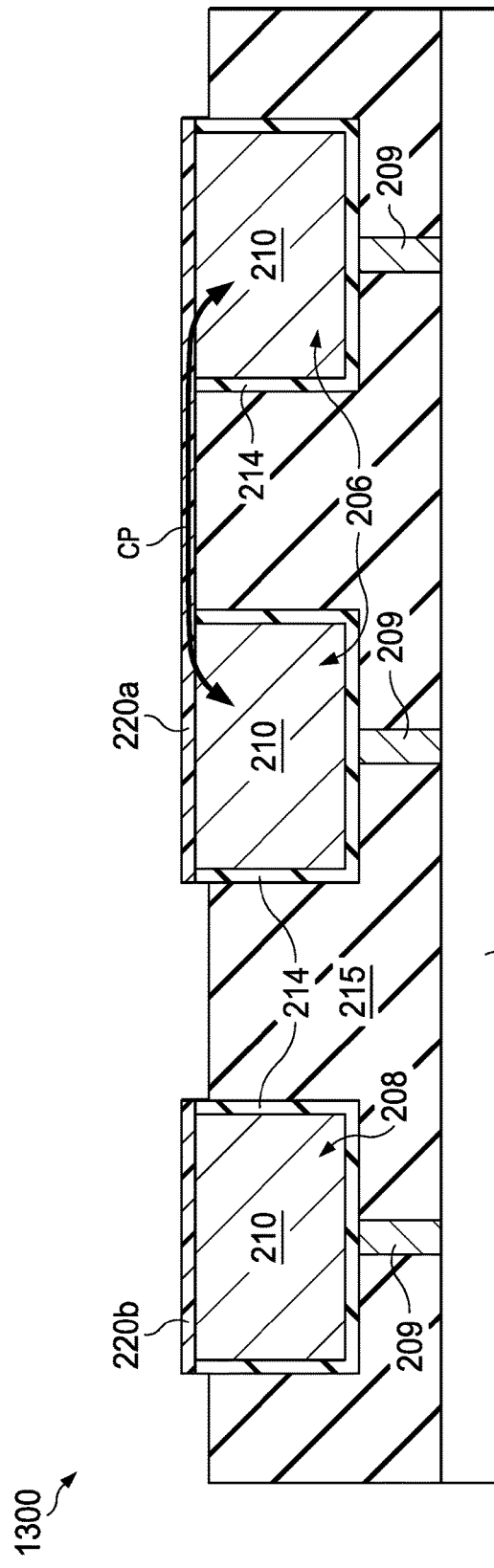

FIGS. 13A and 13B show the example IC structure 1300 after forming and etching an e-fuse/barrier layer 220 to define (a) an e-fuse element 220a over a pair of e-fuse terminals 206 and over a portion of dielectric region 215 therebetween, and (b) an interconnect diffusion barrier region 220b over a lower interconnect structure 208. Thus, FIGS. 13A and 13B correspond with FIGS. 6A and 6B discussed above.

Figure 14A:
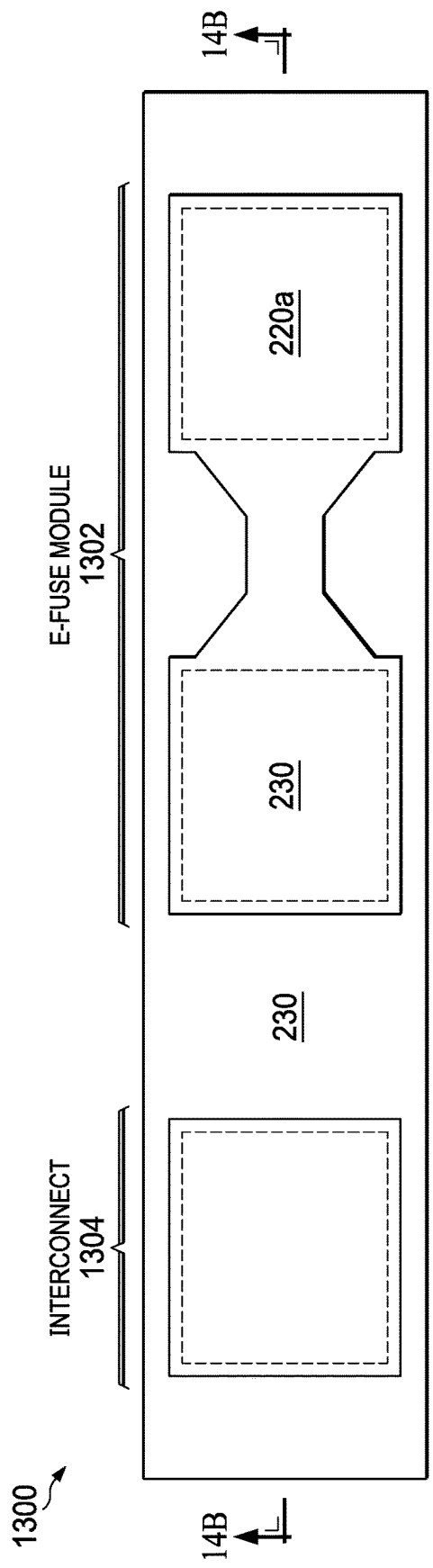
Figure 14B:
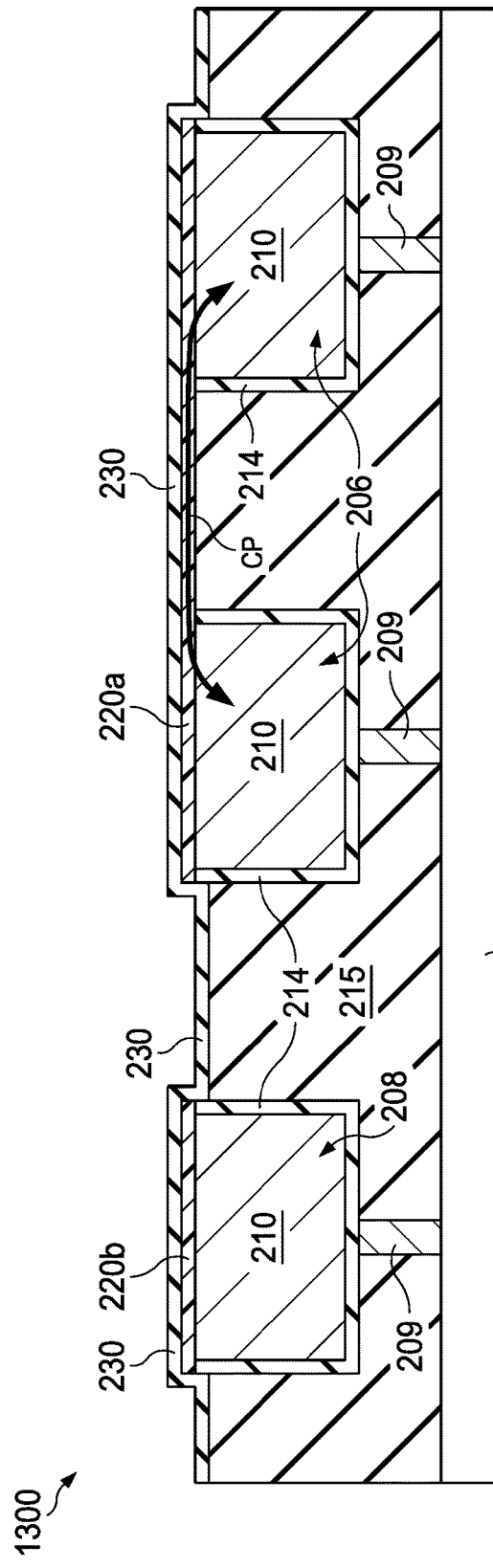
Figure 15:
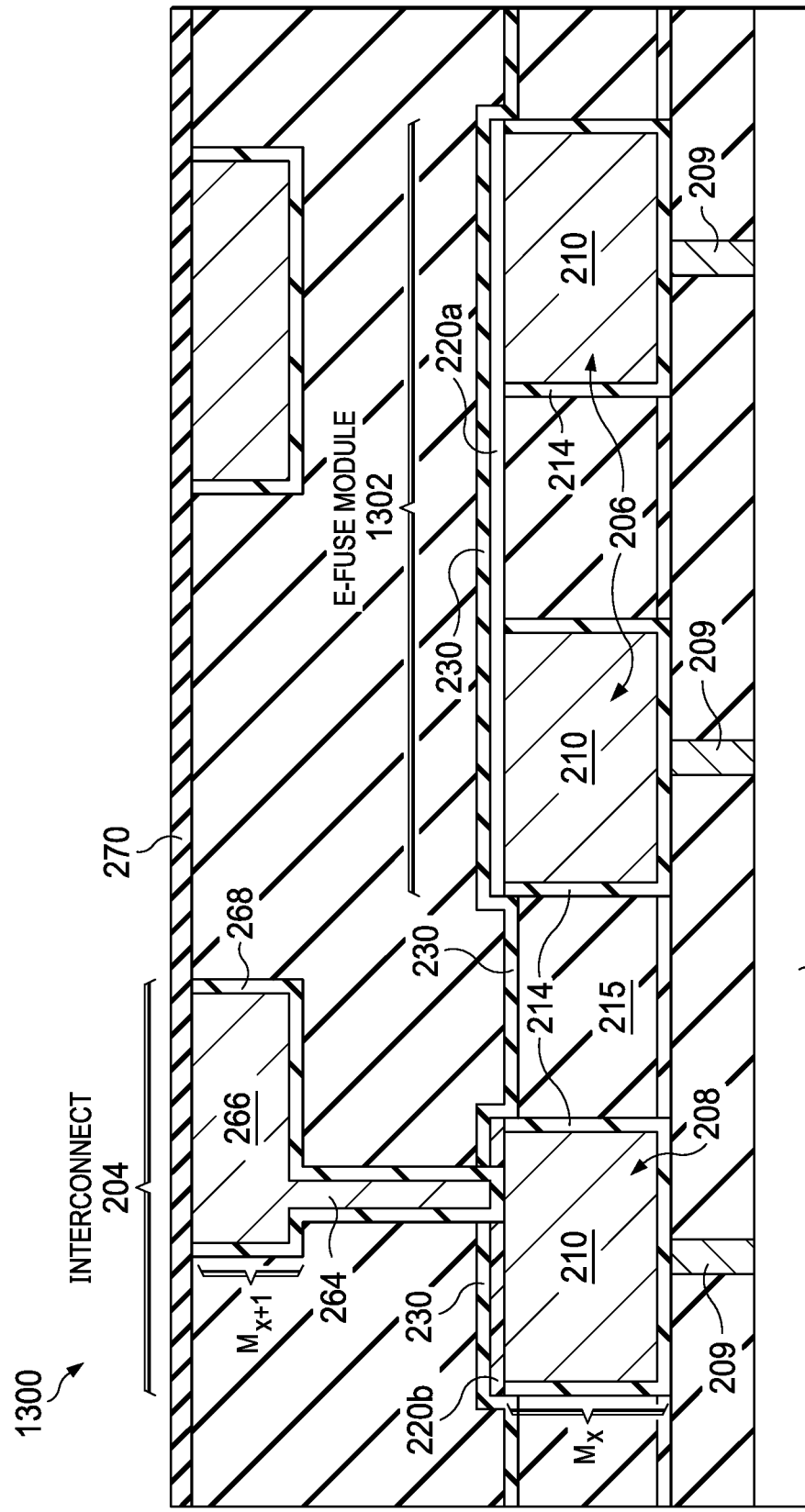

Next, as shown in FIGS. 14A and 14B, a supplemental dielectric barrier layer 230 is deposited on the waver, coving the e-fuse element 220a, interconnect diffusion barrier region 220b, and exposed portions of the dielectric region 215. The dielectric barrier layer 230 may comprise SiN or SiC, or other dielectric material that provides additional protection against metal diffusion from underlying metal elements 210. The dielectric barrier layer 230 may be deposited by Plasma Enhanced Chemical Vapor Deposition (PECVD), or other suitable technique. In some embodiments, the dielectric barrier layer 230 may have a thickness in the range of 250 Å-1000 Å, or about 500 Å.

Next, unlike the embodiment shown in FIGS. 8A-12 discussed above, in this embodiment the IC manufacturing process may continue with the dielectric barrier layer 230 left intact (e.g., not selectively etched over each metal element 210). For example, as shown in the side cross-sectional view of FIG. 15, interconnect formation may continue, for example to contact the lower interconnect element 208 to an upper interconnect element 266 (e.g., metal trench element 266) by an interconnect via 264. In the illustrated embodiment, upper interconnect element 266 and interconnect via 264 comprise a dual damascene Cu structure, e.g., formed by depositing a barrier layer 268 (e.g., a Ta/TaN bilayer), copper seed, and followed by copper plating, in a dual damascene trench. A copper CMP process is then performed to remove the excess copper. Finally, a dielectric barrier layer 270, e.g., comprising silicon nitride (SiN) or silicon carbide (SiC), without limitation, may be formed over metal layer $M_{x+1}$.

The invention claimed is:

1. A method of forming an integrated circuit structure, comprising:
   forming a plurality of metal structures in a metal layer, the plurality of metal structures defining a pair of metal e-fuse terminals and a metal interconnect element spaced apart from the pair of metal e-fuse terminals;
   depositing a single conductive e-fuse/barrier layer on the plurality of metal structures, the single conductive e-fuse/barrier layer comprising a conductive material that provides a barrier against metal diffusion; and
   patterning the single conductive e-fuse/barrier layer to define:
   (a) an e-fuse element defined by a first portion of the single conductive e-fuse/barrier layer in contact with the pair of metal e-fuse terminals, the e-fuse element providing a conductive path between the metal e-fuse terminals through the e-fuse element to define an e-fuse module; and
   (b) an interconnect diffusion barrier region defined by a second portion of the single conductive e-fuse/barrier layer located on the metal interconnect element, the second portion of the single conductive e-fuse/barrier layer being physically distinct from the first portion of the single conductive e-fuse/barrier layer;
   wherein the single conductive e-fuse/barrier layer defines both the e-fuse element and the interconnect diffusion barrier region; and
   depositing a dielectric layer directly on at least the first portion of the single conductive e-fuse/barrier layer defining the e-fuse element.

2. The method of claim 1, wherein the single conductive e-fuse/barrier layer comprises TiW or TiW$_2$N.

3. The method of claim 1, wherein the single conductive e-fuse/barrier layer comprises NiCr, TiN, or TaN.

4. The method of claim 1, wherein forming the plurality of metal structures in the metal layer comprises forming a plurality of copper trench elements in a copper interconnect layer.

5. The method of claim 1, wherein forming the plurality of metal structures in the metal layer comprises forming a plurality of copper damascene structures.

6. The method of claim 1, wherein depositing the dielectric layer directly on at least the first portion of the single conductive e-fuse/barrier layer comprises forming a dielectric barrier layer directly on at least the first portion of the single conductive e-fuse/barrier layer before patterning the single conductive e-fuse/barrier layer; and wherein patterning the single conductive e-fuse/barrier layer comprises patterning the dielectric barrier layer together with the single conductive e-fuse/barrier layer.

7. The method of claim 1, wherein depositing the dielectric layer directly on at least the first portion of the single conductive e-fuse/barrier layer comprises forming a dielectric barrier layer directly on at least the first portion of the single conductive e-fuse/barrier layer after patterning the single conductive e-fuse/barrier layer.

8. The method of claim 1, wherein depositing the dielectric layer directly on at least the first portion of the single conductive e-fuse/barrier layer comprises forming a dielectric barrier layer comprising SiC or SiN directly on at least the first portion of the single conductive e-fuse/barrier layer.

9. The method of claim 1, wherein the single conductive e-fuse/barrier layer consists of either TiW or TiW$_2$N.

10. The method of claim 1, wherein depositing the dielectric layer directly on at least the first portion of the single conductive e-fuse/barrier layer comprises forming a dielectric region over the e-fuse module and over the metal interconnect element; and
the method comprises forming an interconnect via in the dielectric region, the interconnect via conductively connected to the metal interconnect element.

11. A method of forming an integrated circuit structure, comprising:
forming a plurality of metal structures in a metal layer, the plurality of metal structures defining a pair of metal e-fuse terminals and a metal interconnect element spaced apart from the pair of metal e-fuse terminals;
depositing a single conductive e-fuse/barrier layer on the plurality of metal structures, the single conductive e-fuse/barrier layer comprising a conductive material that provides a barrier against metal diffusion; and
patterning the single conductive e-fuse/barrier layer to define:
(a) an e-fuse element defined by a first portion of the single conductive e-fuse/barrier layer in contact with the pair of metal e-fuse terminals, with no other conductive layer formed on the first portion of the single conductive e-fuse/barrier layer, wherein the e-fuse element fully covers a top surface of both metal e-fuse terminals to provide a barrier against metal diffusion from the metal e-fuse terminals, and wherein the e-fuse element provides a conductive path between the metal e-fuse terminals through the e-fuse element to define an e-fuse module; and
(b) an interconnect diffusion barrier region defined by a second portion of the single conductive e-fuse/barrier layer located on the metal interconnect element, the second portion of the single conductive e-fuse/barrier layer being physically distinct from the first portion of the single conductive e-fuse/barrier layer;
such that the same conductive material of the single conductive e-fuse/barrier layer defines both the e-fuse element and the interconnect diffusion barrier region.

12. The method of claim 11, wherein the interconnect diffusion barrier region fully covers a top surface of the metal interconnect element to provide a barrier against metal diffusion from the metal interconnect element.

* * * * *